(12) United States Patent
Yamaji

(10) Patent No.: US 6,587,994 B1
(45) Date of Patent: Jul. 1, 2003

(54) HOT-CARRIER DEGRADATION SIMULATION OF A SEMICONDUCTOR DEVICE

(75) Inventor: Mitsuru Yamaji, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/523,062

(22) Filed: Mar. 9, 2000

(30) Foreign Application Priority Data

Mar. 9, 1999 (JP) ............................................. 11-061081

(51) Int. Cl.[7] .............................................. G06F 17/50
(52) U.S. Cl. .................................. 716/4; 716/5; 703/18
(58) Field of Search ............................. 716/1, 2, 4, 18; 703/13, 14, 18; 257/218, 376, 404, 405, 407; 438/543

(56) References Cited

U.S. PATENT DOCUMENTS

| | | | | | |
|---|---|---|---|---|---|
| 5,600,578 | A | * | 2/1997 | Fang et al. | 324/765 |
| 6,009,017 | A | * | 12/1999 | Guo et al. | 365/185.18 |
| 6,031,272 | A | * | 2/2000 | Hiroki et al. | 257/404 |
| 6,040,610 | A | * | 3/2000 | Noguchi et al. | 257/314 |
| 6,215,146 | B1 | * | 4/2001 | Umeda et al. | 257/315 |

* cited by examiner

*Primary Examiner*—Matthew Smith
*Assistant Examiner*—Paul Dinh
(74) *Attorney, Agent, or Firm*—Staas & Halsey LLP

(57) ABSTRACT

A hot-carrier degradation simulation process of a MIS transistor includes the step of: calculating a degradation of a device characteristic of a metal-insulator-semiconductor transistor by using at least both of deep surface states and shallow surface states formed in a gate insulation film.

18 Claims, 16 Drawing Sheets

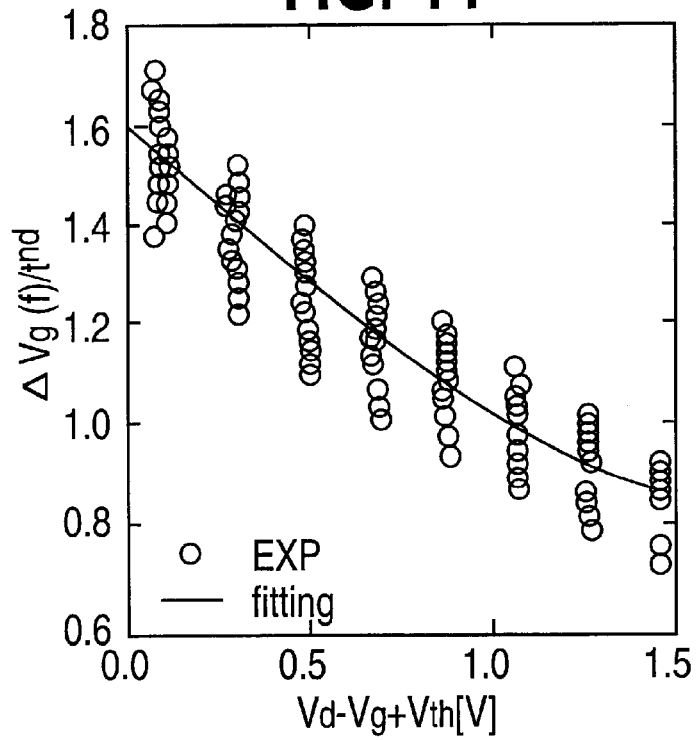
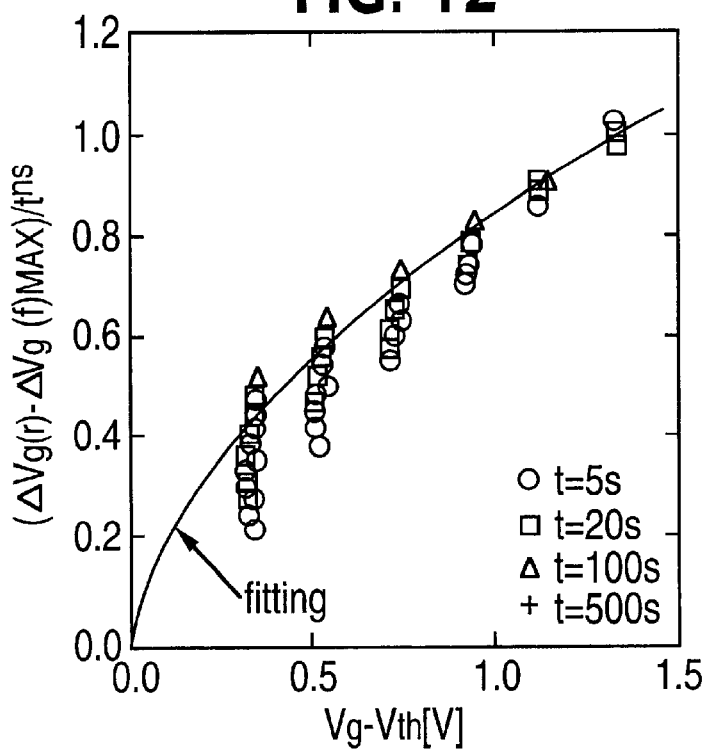

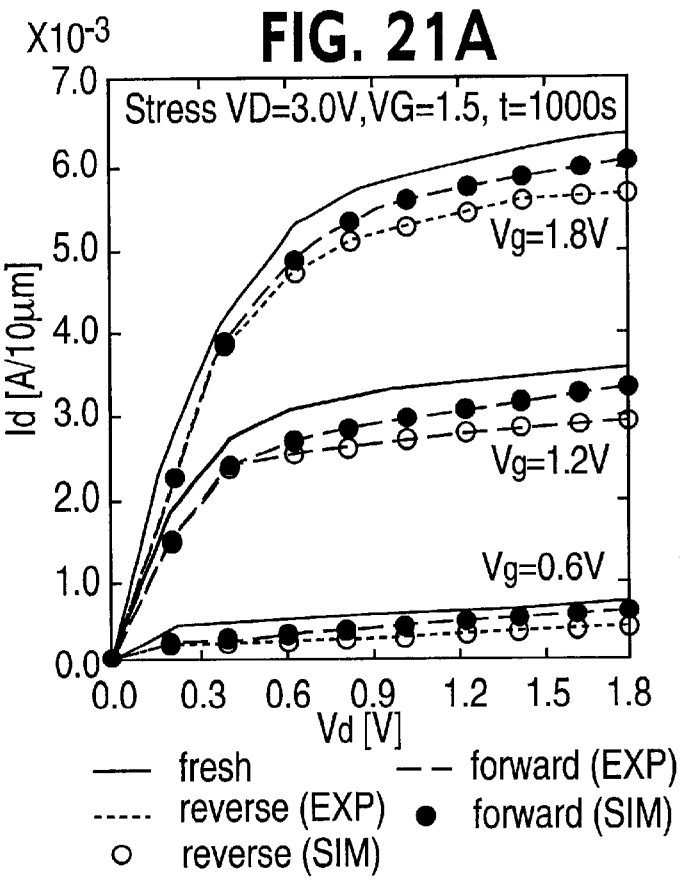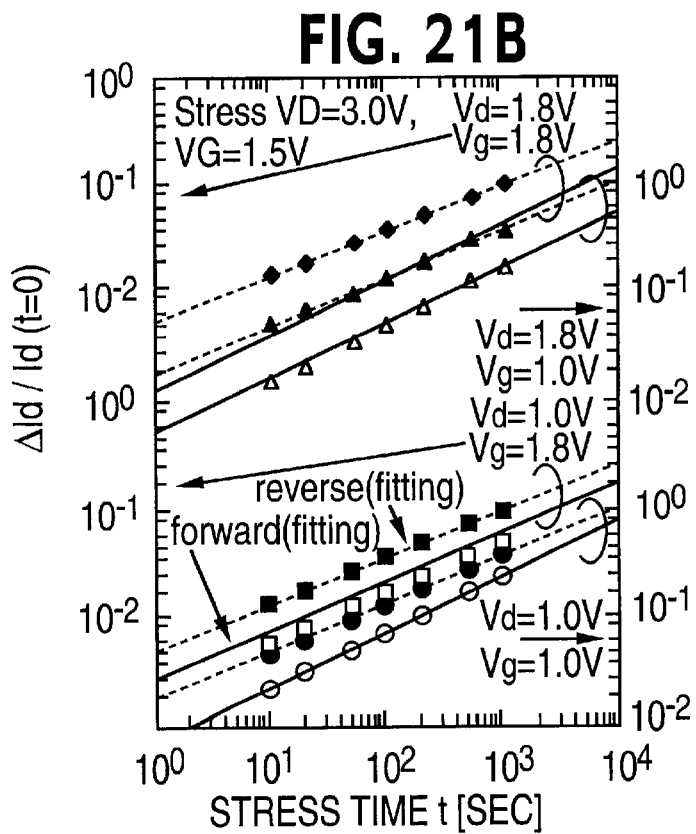

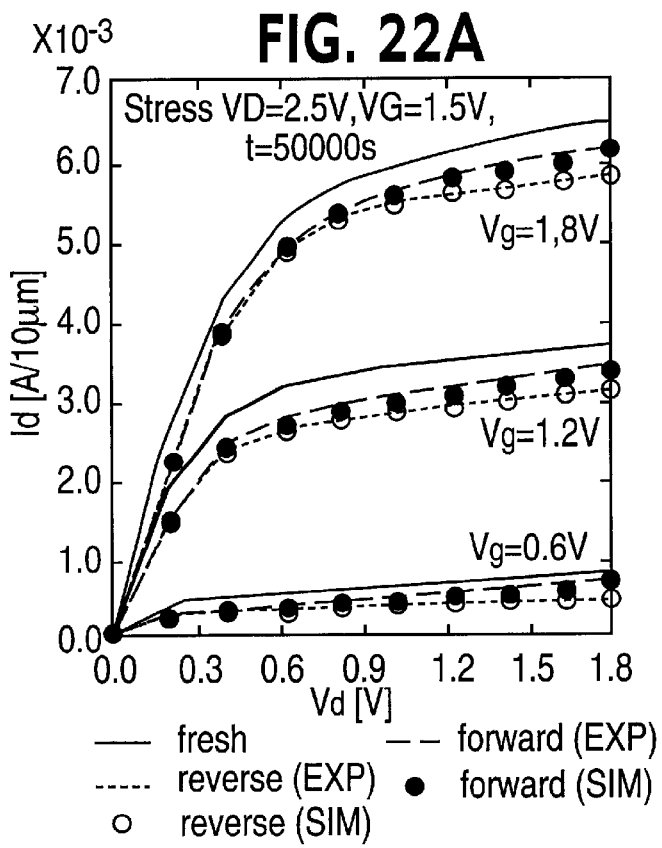
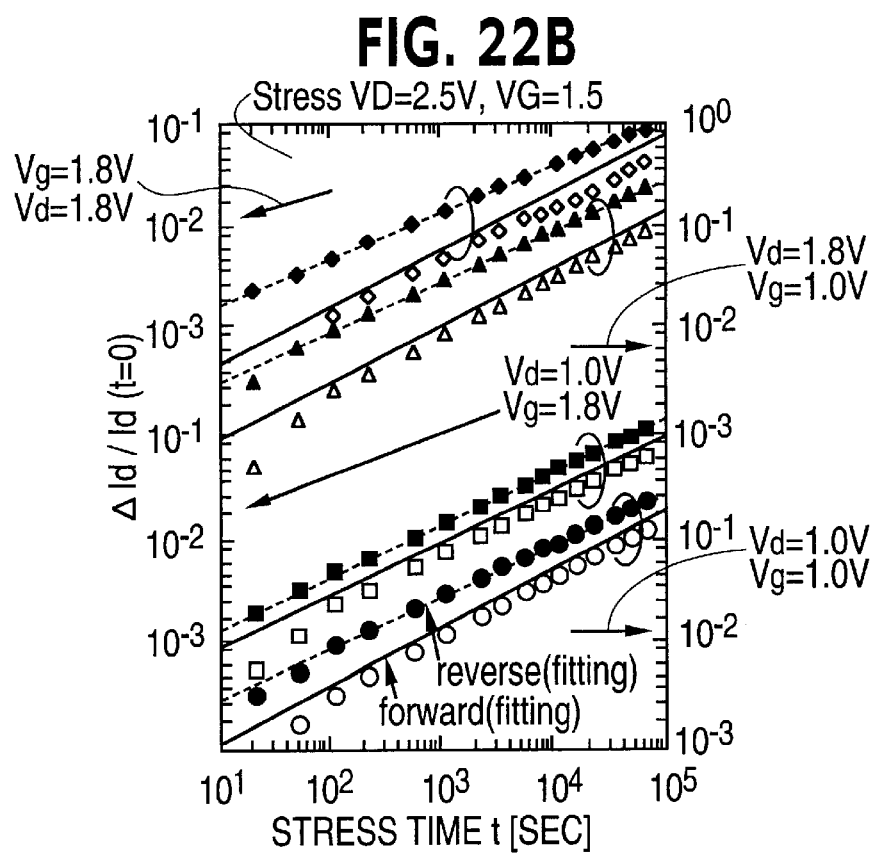

HOT-CARRIER DEGRADATION SIMULATION OF A SEMICONDUCTOR DEVICE

CROSS-REFERENCE TO RELATED APPLICATION

The present application is based on Japanese priority applications No. 11-061081 filed on Mar. 9, 1999, the entire contents of which are hereby incorporated by reference.

BACKGROUND OF THE INVENTION

The present invention generally relates to fabrication of semiconductor devices and more particularly to a hot-carrier degradation simulation of a MIS transistor for use in a fabrication process of a MIS transistor. In more detail, the present invention is related to a high-precision hot-carrier degradation simulation applicable for a wide variety of bias conditions by caking into consideration the effect of both deep surface states and shallow surface states.

MIS (metal-insulator-semiconductor)-type transistors are used extensively in various semiconductor devices including DRAMs as a fundamental active device. In a MIS transistor, it is well known that carriers are accelerated in the channel region right underneath the gate electrode, particularly in the region adjacent to the drain region called drain edge region.

When the acceleration of carriers is excessive, there are formed hot electrons in the channel region and the hot electrons thus formed are injected to the gate insulation film provided between the substrate and the gate electrode. The carriers thus injected then form surface states in the gate insulation film, wherein the surface states thus formed induce a deterioration in the threshold characteristic of the MIS transistor. Thus, it is necessary to evaluate the hot-carrier degradation of the device characteristic at the time of designing a semiconductor device by way of simulation and to modify the design as a result of the simulation.

In order to carry out such a hot-carrier degradation simulation, an accelerated degradation test has to be conducted for an actual MISFET so as to establish a hot-carrier degradation model.

In the accelerated degradation test, a predetermined drain voltage $V_D$ and a gate voltage $V_G$ are applied to the MISFET to be tested and the degradation of the device characteristic is monitored. As a result of the hot-carrier injection, there may be observed a degradation in the drain current $I_d$ in the form of a drain current change $\Delta I_d$, the threshold voltage $V_{th}$ in the form of a threshold voltage change $\Delta V_{th}$, transconductance gm in the form of $\Delta g_m$, and the like.

Generally, it is accepted that the hot-carrier degradation of a MISFET is represented as $$\mathrm{Deg}(t) = Kt^n \quad (1)$$

wherein Deg(t) represents any of $\Delta I_d$, $\Delta V_{th}$ and $\Delta g_m$. In Eq.(1), the parameter t represents the stress time, which is the accumulated time in which the stress is applied to the tested MISFET.

In view of the fact that the hot carriers causing the device characteristic degradation can be measured indirectly in the form of substrate current $I_{SUB}$, the foregoing equation (1) can be represented with the substrate current $I_{SUB}$ as follows.

$$\mathrm{Deg}(t) = [(I_D/HW)(I_{SUB}/I_D)^m]^n t^n \quad (2)$$

wherein $I_D$ represents the drain current during the accelerated test, that is the stressed state, W represents the gate electrode width, and H represents the fitting parameter. Further, the lifetime $\tau$ of the MISFET is defined as the stress time until a drain current drop of 10% is observed in a reverse biased state.

According to Eqs.(1) and (2), it can be seen that the degradation Deg(t) is proportional to the quantity $t^n$ for all the biasing conditions. Further, it is reduced that the logarithmic plotting of the relationship log t–log $\Delta$Deg(t) provides a number of parallel lines. Further, the logarithmic plotting of the relationship $\log(\tau I_D) - \log(I_{SUB}/I_D)$ provides a single line.

FIG. 1 shows an example of the accelerated test.

During the acceleration test, a drain voltage $V_D$ of 3.0V and a gate voltage $V_G$ of 2.0V are applied to the MISFET as a DC stress, and FIG. 1 represents the observed drain current change $\Delta I_d$ as a function of the stress time t in a logarithmic scale (log $\Delta I_d$–log t) plot. In FIG.1, it should be noted that the drain current change $\Delta I_d$ is represented for various biasing conditions as indicated in FIG. 1 and is represented in the form of a normalized, dimensionless quantity. In the example of FIG. 1, $\Delta I_d$ and t are normalized with respect to the state of $\Delta I_d$=1 and t=10,000 seconds, for facilitating the comparison of the plot. In the description hereinafter, it is assumed that the suffix represented in a capital letter indicates that the quantity to which the suffix is attached represents the stress condition in the acceleration test while the suffix represented in a small letter indicates that the quantity to which the suffix is attached represents the bias condition used in the measurement after the acceleration test.

Now, when the Eqs.(1) and (2) are valid, then it is predicted that all the plotting points in FIG. 1 are supposed to align on the lines having the same slope. However, FIG. 1 clearly indicates that the slope, and hence the exponent n of Eqs.(1) and (2), changes with the bias condition of the MISFET used at the time of the measurement. The result of FIG. 1 thus indicates that Eqs.(1) and (2) are not valid for wide variety of biasing conditions but valid for only a limited range of biasing condition such as $V_d = V_g$ =supply voltage. Further, even when the foregoing condition of $V_d = V_g$ =supply voltage is satisfied, the slope, and hence the exponent n, still changes when the biasing is changed under the foregoing constraint.

FIG. 2 shows the D.C.-stress dependence of the exponent n, wherein FIG. 2 uses a difference between the drain voltage $V_D$ and the gate voltage $V_G$ used for the D.C. stress as a horizontal axis.

Referring to FIG. 2, it can be seen that the value of the exponent n, and hence the slope, changes when the absolute value of $V_D$ or $V_G$ is changed, even in such a case the difference $V_D - V_G$ is held constant.

FIG. 3 shows the relationship between the D.C. stress condition and the lifetime $\tau$ of the MISFET, wherein FIG. 3 defines the lifetime $\tau$ as the stress time until there is observed a 10% drop of the drain current $I_d$ as noted before. In FIG. 3, the horizontal axis represents $I_{SUB}/I_D$, while the vertical axis represents $\tau I_D$.

As can be seen clearly from FIG. 3, there appear a plurality of lines in correspondence to each of the stress conditions ($V_D - V_G$), wherein the existence of such plural lines is contradictory to the conventional model of Eqs.(1) and (2).

Thus, it is concluded that the conventional hot-carrier degradation model of Eqs.(1) and (2) cannot describe the characteristic degradation of a MISFET over a wide range of bias conditions.

SUMMARY OF THE INVENTION

Accordingly, it is a general object of the present invention to provide a novel and useful hot-carrier degradation simulation method of a semiconductor device and a fabrication process of a semiconductor device that uses such a simulation method, wherein the foregoing problems are eliminated.

Another and more specific object of the present invention is to provide a hot-carrier degradation simulation process of a MIS transistor that takes into consideration the effect of deep surface states and shallow surface states when calculating a degradation of device characteristics.

Another object of the present invention is to provide a fabrication process of a semiconductor device including the step of determining a process condition of a MIS transistor based on a result of such a hot-carrier degradation simulation process.

Another object of the present invention is to provide a computer-readable medium storing a hot-carrier degradation simulation process of such a MIS transistor.

Other objects and further features of the present invention will become apparent from the following detailed description when read in conjunction with the attached drawings.

BRIEF DESCRIPTION OF THE DRAWINGS

FIG. 11 is a diagram showing the bias dependence of a function related to the deep surface states;

FIG. 12 is a diagram showing the bias dependence of a function related to the shallow surface states;

FIGS. 21A and 21B are diagrams showing the comparison with the result of the simulation and actual device characteristic under a fist stress condition;

FIGS. 22A and 22B are diagrams showing the comparison with the result of the simulation and actual device characteristic under a second stress condition.

DETAILED DESCRIPTION OF THE INVENTION

OVERVIEW OF THE PROCESS

Figure 1:
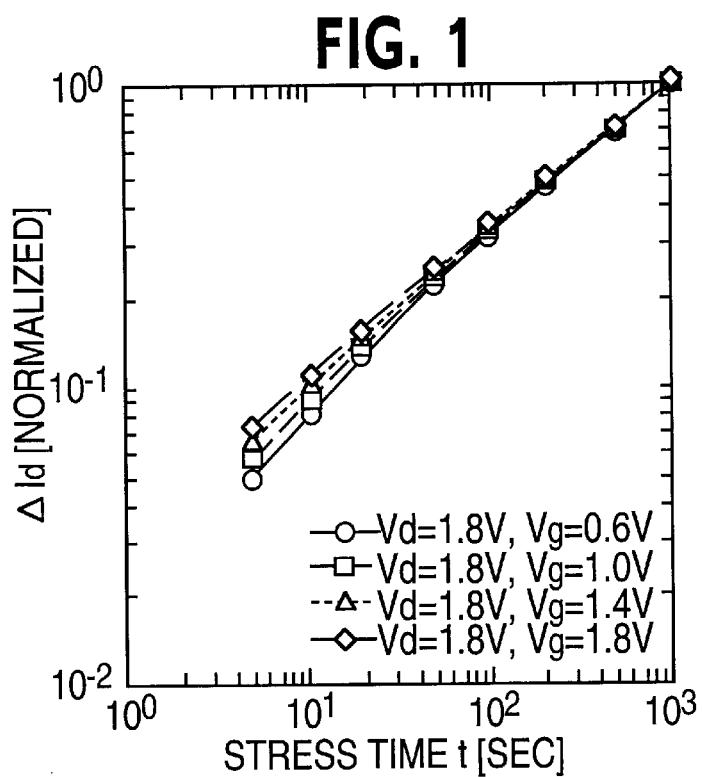
FIG. 1 is a diagram showing the stress time dependence of the drain current change according to a hot-carrier degradation process of a related art.
Figure 2:
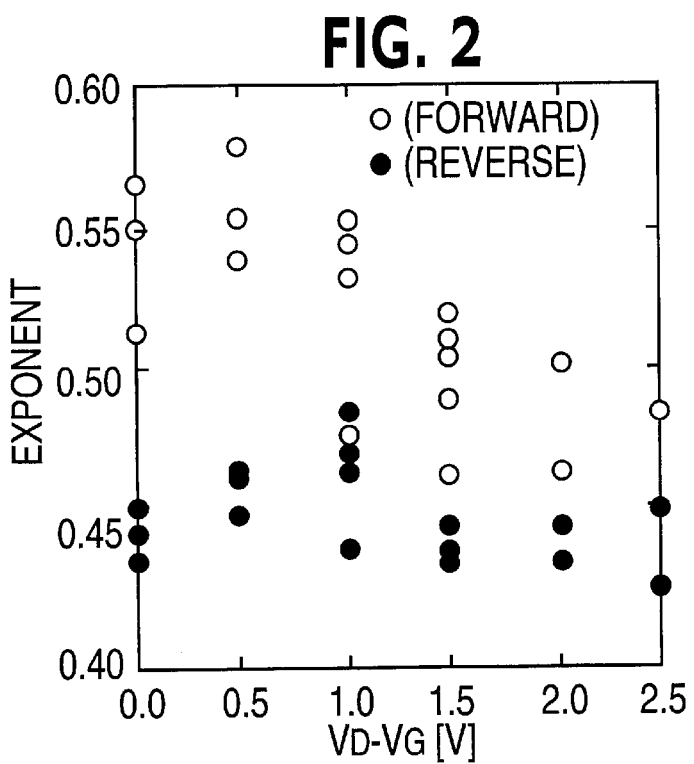
FIG. 2 is a diagram showing the stress condition dependence of an exponent used in the hot-carrier degradation process of the related art.
Figure 3:
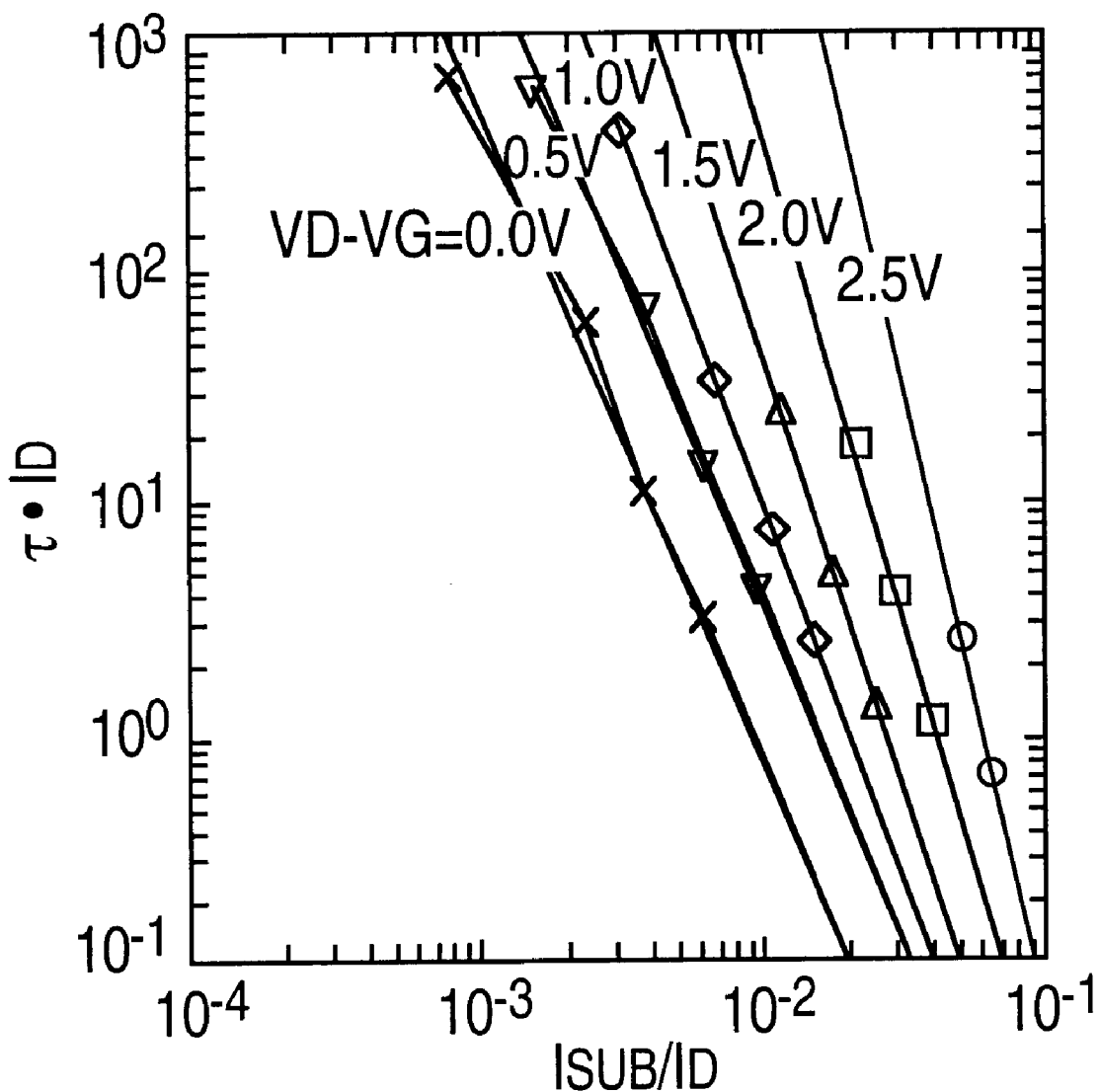
FIG. 3 is a diagram showing the relationship between a device lifetime and a stress condition according to the hot-carrier degradation process of the related art.
Figure 4:
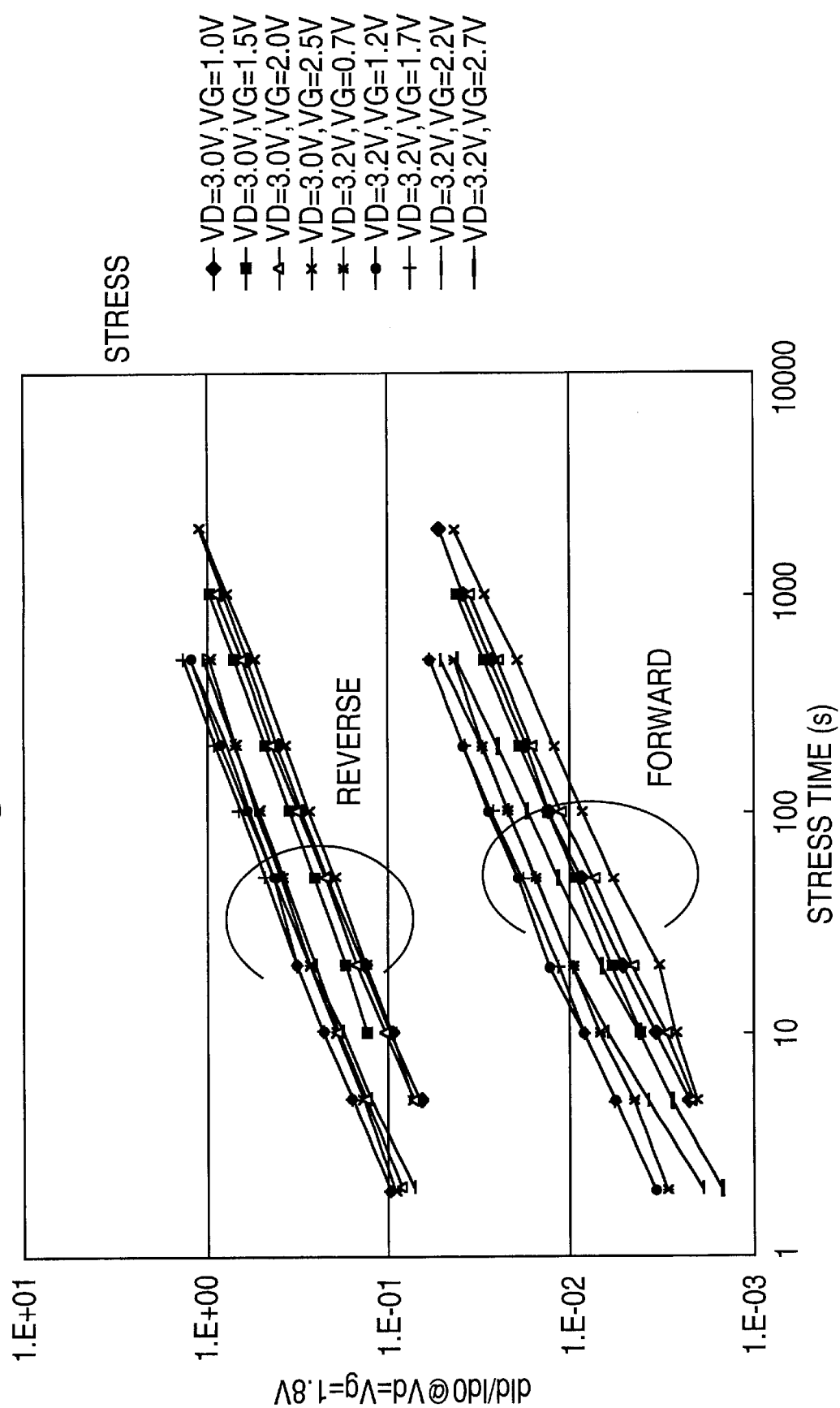
FIG. 4 is a diagram showing an example of a D.C. stress test used in the present invention.

FIG. 4 shows an example of the acceleration test of the MISFET conducted in advance of the simulation process of the present invention.

Figure 5:
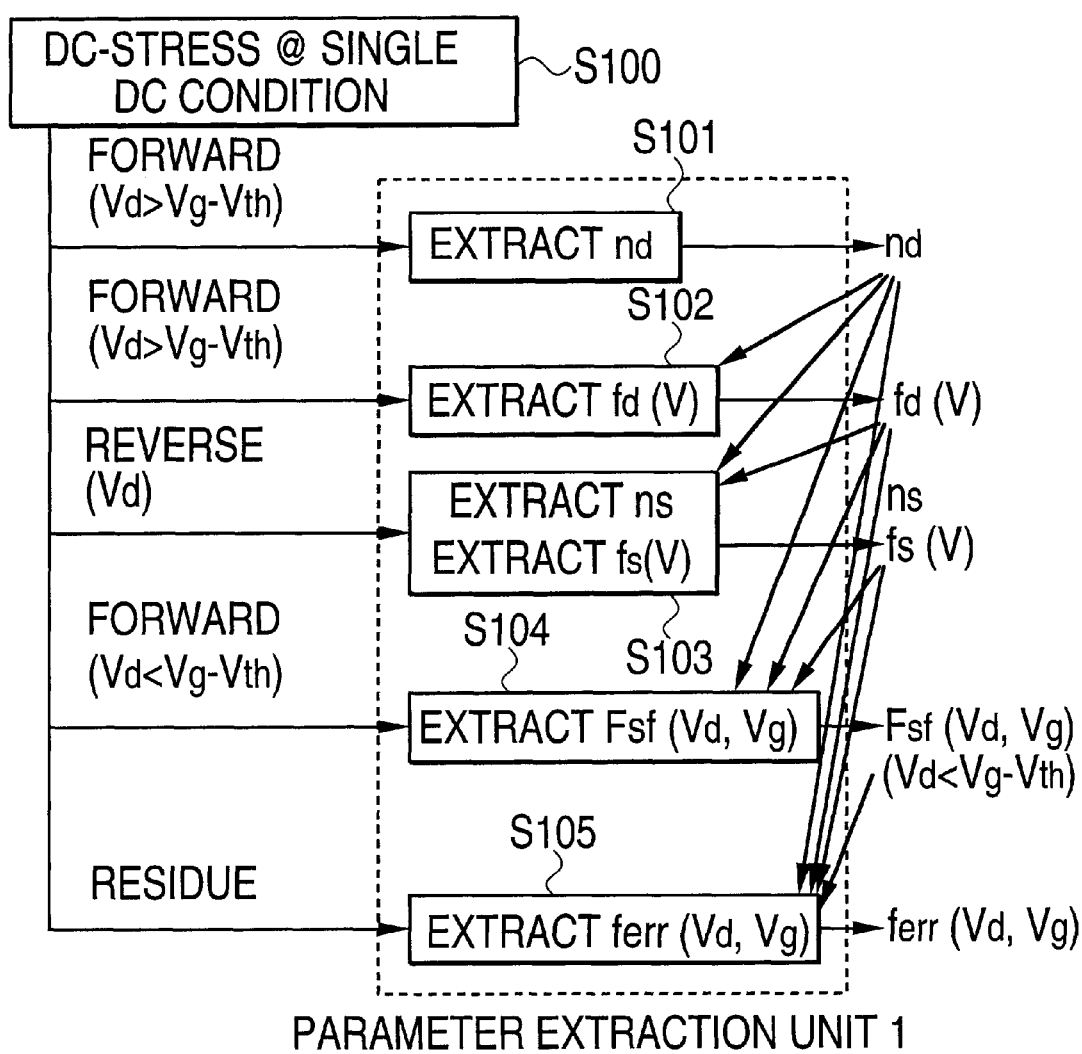
FIG. 5 is a flowchart showing the overall process of the hot-carrier degradation simulation according to the present invention.

Referring to FIG. 5, the tested MISFET is a n-channel MOS transistor having a gate length L of 0.18 μm, a gate width W of 10 μm and a gate oxide film thickness $t_{ox}$ of 4 nm, and various combinations of the drain voltage $V_D$ and the gate voltage $V_G$ are applied to the drain electrode and the gate electrode as the stress. In FIG. 4, the change of the drain current $I_d$ with respect to the initial drain current $I_{do}$ ($dI_d/I_{do}$) is observed for the MISFET thus applied with the stress for various durations while setting the gate voltage $V_g$ and the drain voltage $V_d$ to 1.8 V. The parameter $dI_d/I_{do}$ thus obtained is used as the foundation of the simulation to be explained below.

Next, an overview of the simulation process of the present invention will be described with reference to the flowchart of FIG. 5. Detailed explanation of the quantities appearing below will be given later.

Referring to FIG. 5, the exponent $n_d$ of the quantity $t^{nd}$, which represents the slope of the degradation $\Delta Deg(t)$, is extracted in a step 101 by using a parameter extraction unit 1 for a forward-biasing state. The step 101 is conducted for a forward saturation condition in which there holds a relationship $V_d > V_g - V_{th}$, while using the observed data of hot carrier degradation under a single D.C. stress condition obtained in a step S100, which corresponds to the process explained above with reference to FIG. 4.

Next, in a step 102, a function $f_d(V)$ related to the deep surface states for the forward-bias saturation region is extracted from the hot-carrier degradation data of the step 100 while using the exponent $n_d$ obtained in the previous step.

Next, in a step 103, an exponent $n_s$ and a function $f_s(V)$ corresponding to a shallow surface states are obtained based on the observed degradation data of the step 100 (see FIG. 4) under a reverse-biasing condition, while using the exponent $n_d$ and the function $f_d(V)$ obtained previously.

Further, in a step 104, a function $F_{sf}(V_d, V_g)$ is extracted for the linear region of the forward-biasing state while using the exponents $n_d$, $n_s$ and the functions $f_d(V)$ and $f_s(V)$.

Further, in a step 105, the degradation data is fitted with the function $F_{sf}(V_d, V_s)$ and the residue of the fitting is represented by a residual function $f_{err}(V_d, V_g)$.

Figure 6:
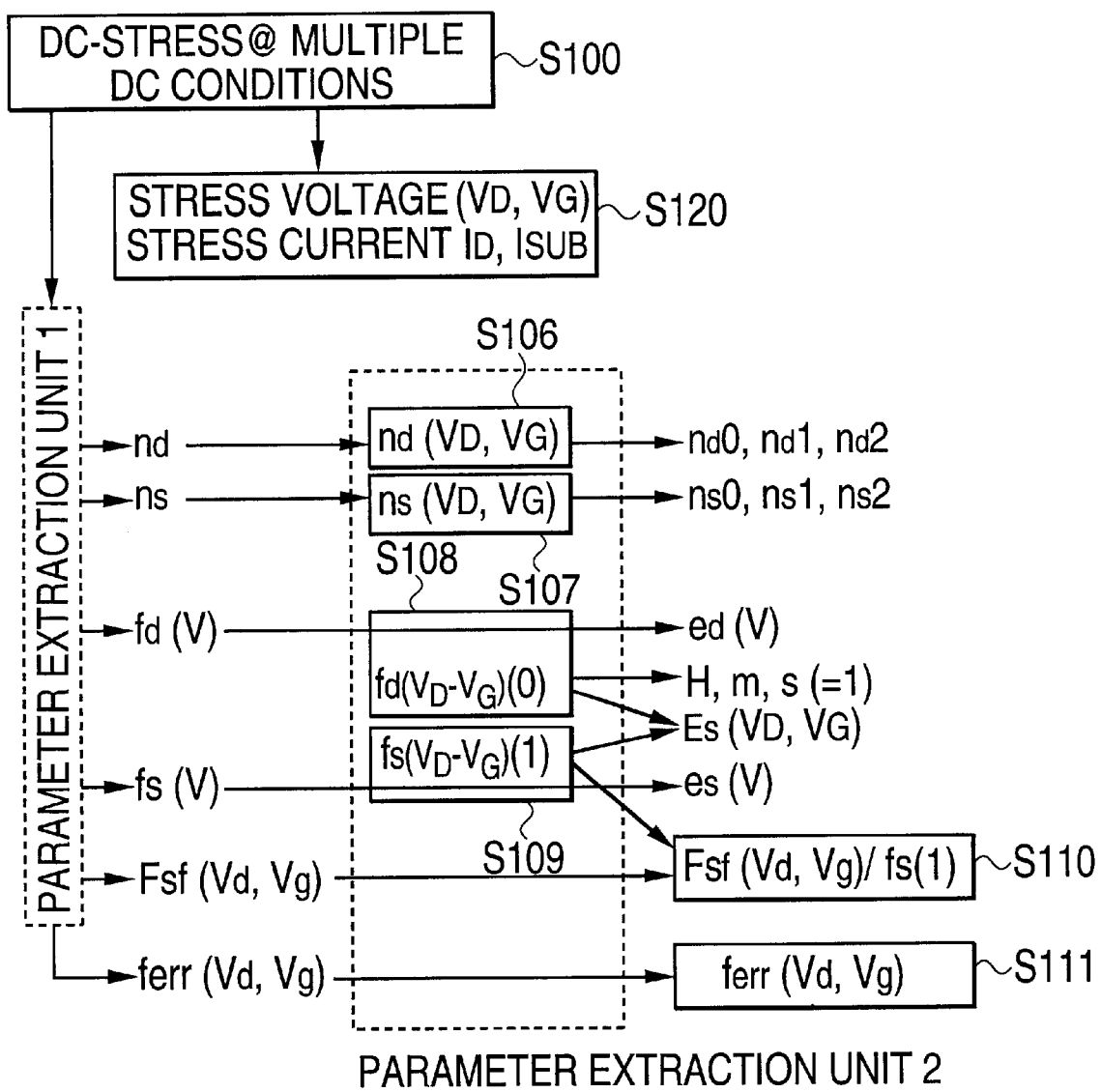
FIG. 6 is another flowchart showing the overall process of the hot-carrier degradation simulation according to the present invention.

Next, in a step 106 of FIG. 6, a parameter extraction unit 2 is used and the exponent $n_d$ for the deep surface states is determined for various D.C. stress conditions while using various D.C. stress conditions. Thereby, the exponent $n_d$ is represented as $n_d(V_D, V_G)$ and the coefficients $n_{d0}$, $n_{d1}$, and $n_{d2}$ determining the function $n_d(V_D, V_G)$ are obtained while using different sets of $(V_D, V_G)$.

Next, in a step 107, the exponent $n_s$ related to the shallow surface states is defined as $n_s(V_D, V_G)$ so as to reflect the various D.C. stress conditions, and the coefficients $n_{s0}$, $n_{s1}$ and $n_{s2}$ determining the function $N_s(V_D, V_G)$ is obtained.

Next, in a step 108, the function $f_d(V)$ related to the deep surface states is represented in the form of $f_{d(VD,VG)}(V)$ so as to reflect various stress conditions, and functions $f_{d(VD,VG)}(0)$ and $e_d(V)$, a coefficient H and exponents m and s determining the function $f_{d(VD,VG)}(V)$ are obtained.

Next, in a step 109, the function $f_s(V)$ related to the shallow surface states is represented in the form of $f_{s(VD,VG)}(V)$ so as to reflect various stress conditions, and functions $f_{s(VD,VG)}(1)$, $e_s(V)$ and $E_{s(VD,VG)}$ determining the function $f_{s(VD,VG)}(V)$ are obtained.

Next, in a step 110, the function $F_{sf}(V_d, V_s)$ for the shallow surface states is normalized by the function $f_{s(VD,VG)}(1)$ obtained in the step 109.

Finally, in a step 111, the residual function $f_{err}(V_d, V_g)$ is represented in the form of $f_{err}(V_D, V_G)(V)$ so as to reflect various D.C. stress conditions, and the function $f_{err}(V_D, V_G)(V)$ is obtained as the average of the various D.C. stress conditions.

PHYSICS AND PRINCIPLE

Figure 7A:
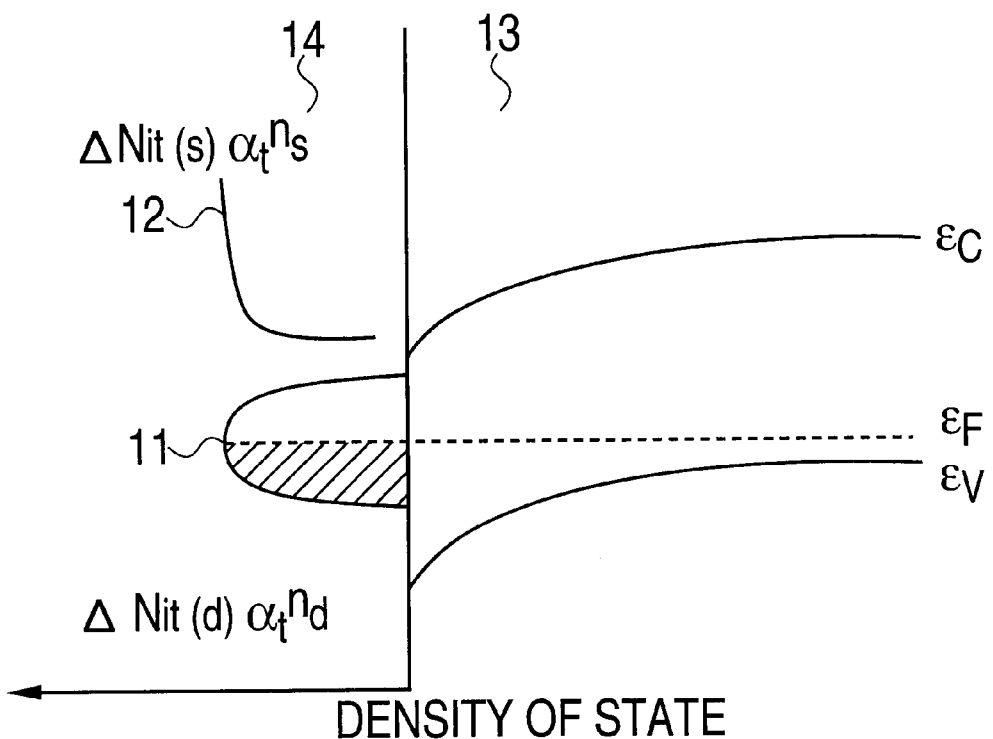
FIGS. 7A and 7B are band diagrams showing the deep surface states and shallow surface states formed in a MISFET.
Figure 7B:
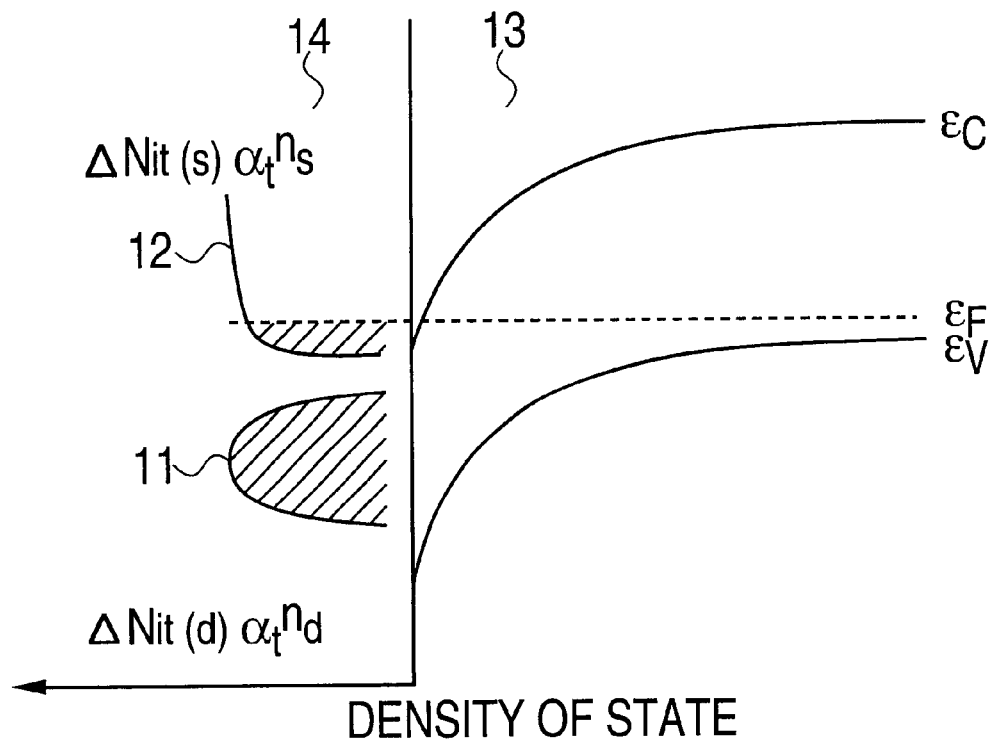

Next, the physics and principle of the present invention will be explained with reference to FIGS. 7A and 7B showing the band structure of a gate insulation film 14 for the part including the interface between the gate insulation film 14 and a semiconductor substrate 13 constituting the channel region of an n-channel MISFET.

Referring to FIG. 7A, it can be seen that there are formed deep surface states 11 generally at the center of the forbidden band defined by a conduction band Ec and a valence band Ev, and there is further formed shallow surface states 12 in the vicinity of the conduction band Ec.

In such a gate insulation film, the number of the deep surface states $N_{it(d)}$ and the number of the shallow surface states $N_{it(s)}$ created as a result of trapping of hot carriers with time t are represented as $$N_{it(d)}(t) = K_d t^{n_d} \quad (3)$$

$$N_{it(s)}(t) = K_s t^{n_s} \quad (4)$$

where $n_d$ and $n_s$ are exponents respectively for the deep surface states and the shallow surface states.

As the deep surface states 11 and the shallow surface states 12 are thus created according to the relationship of Eqs. (3) and (4), the amount of electrons $\Delta N_{it(d)}(t)$ and $\Delta N_{it(s)}(t)$ captured by the deep and shallow surface states are also proportional to the factor $t^{n_d}$ or $t^{n_s}$.

When the gate voltage $V_g$ applied to the MISFET, in which the foregoing two types of surface states are formed as a result of the acceleration test, is low as in the case of FIG. 7A, the Fermi level $e_F$ at the semiconductor-insulator interface of the gate insulation film 14 is low, and the electrons constituting the inversion layer are captured only by the deep surface states 11. Thereby, the total number of the electrons $\Delta N_{it}$ captured by the gate insulation film 14 is represented as $$\Delta N_{it} = \Delta N_{it(d)} + \Delta N_{it(s)} \approx \Delta N_{it(d)} t^n.$$

Thus, there holds a relationship $n \approx n_d$.

In the situation of FIG. 7B, in which a large gate voltage $V_g$ is applied to the MISFET, it can be seen that the Fermi level $e_F$ at the insulator-semiconductor interface of the gate insulation film 13 is low, and the electrons are captured not only by the deep surface states 11 but also by the shallow surface states 12. With increasing gate voltage $V_g$, the proportion of the electrons captured by the shallow surface states is increased.

In the situation of FIG. 7B, therefore, there hold a relationship $$\Delta N_{it} = \Delta N_{it(d)} + \Delta N_{it(s)} t^n.$$

Assuming that $n_s < n_d$, there hold a relationship $$n_s < n < n_d.$$

Summarizing above, it is concluded that the degradation Deg(t) of the MISFET is represented as $$\text{Deg}(t) \, t^{n_d}$$

under the condition in which the gate voltage $V_g$ is low, and further as $$\text{Deg}(t) \, t^{n_s},$$

under the condition in which the gate voltage $V_g$ is high.

Figure 8:
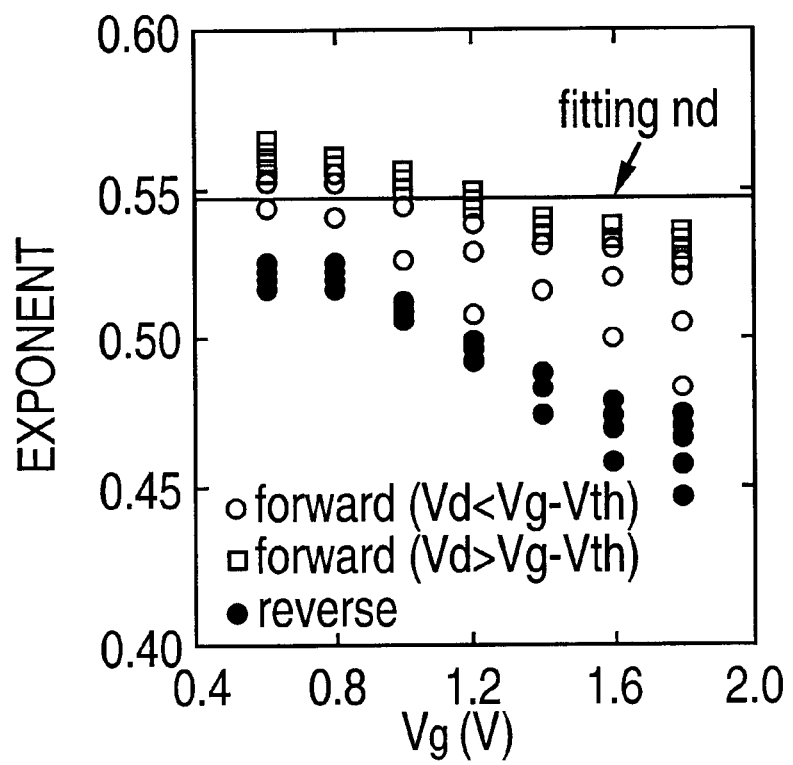
FIG. 8 is a diagram showing the gate voltage dependence of the exponent corresponding to the deep surface states.

FIG. 8 shows the observed gate voltage ($V_g$) dependence of the exponent n representing the device characteristic degradation for various DC stress conditions. In view of the decreasing tendency of the exponent n with increasing bias voltage $V_g$, it will be understood that the foregoing assumption of $n_s < n_d$ is in fact valid.

Thus, the degradation of the MISFET is represented, by taking into consideration the effect of the deep and shallow surface states, not as given by Eq.(1) but as follows:

$$\text{Deg}(V_d, V_g, t) = F_d(V_d, V_g, N_{it(d)}(t)) + F_s(V_d, V_g, N_{it(s)}(t)).$$

In view of the fact that the quantity Deg($V_d$, $V_g$, t) should be proportional to the number of the surface states $N_{it(d)}(t)$ and $N_{it(s)}(t)$ created by the hot carriers, and further in view of the fact that number of the surface states $N_{it(d)}(t)$ and $N_{it(s)}(t)$ are proportional to the terms $t^{n_d}$ and $t^{n_s}$ as represented in Eqs.(3) and (4), the quantity Deg($V_d$, $V_g$, t) is represented as $$\text{Deg}(V_d, V_g, t) = F_d(V_d, V_g) t^{n_d} + F_s(V_d, V_g) t^{n_s}. \quad (5)$$

It should be noted that the foregoing representation of the degradation of Eq.(5) can be further divided into two equations respectively corresponding to the case of biasing the MISFET, when measuring the characteristic, in the same direction used for biasing the MISFET during the D.C. stress test (forward biasing) and the case of biasing the MISFET in the opposite direction (reverse biasing) as $$\text{Deg}_f(V_d, V_g, t) = F_{df}(V_d, V_g) t^{n_d} + F_{sf}(V_d, V_g) t^{n_s}, \text{ and} \quad (6)$$

$$\text{Deg}_r(V_d, V_g, t) = F_{dr}(V_d, V_g) t^{n_d} + F_{sr}(V_d, V_g) t^{n_s}, \quad (7)$$

wherein $F_{df}$ and $F_{dr}$ are functions for the deep surface states in the case the foregoing forward biasing is applied, while $F_{df}$ and $F_{dr}$ are functions for the deep surface states in the case the reverse biasing is applied.

FIRST EMBODIMENT

Hereinafter, a first embodiment of the present invention will be described with reference to the flowchart of FIGS. 5 and 6.

As noted already, the degradation of the characteristic $Deg(V_d,V_g,t)$ may represent any of the drain current change $\Delta I_d$, threshold voltage change $\Delta V_{th}$ or the transconductance change $\Delta g_m$. According to the general practice in the art, the degradation $Deg(V_d,V_g,t)$ is represented in terms of the drain current change $\Delta I_d$. When such a representation is adopted, Eq.(5) above takes a form as $$\Delta I_d(V_d, V_g,t)=F_d(V_d,V_g)t^{nd}+F_s(V_d,V_g)t^{ns}. \quad (8)$$

In Eq.(8), it is noted that $\Delta I_d$ increases with time t in proportion with the term $t^{nd}$ or $t^{ns}$. Thus, it is inevitable, as long as the representation of Eq.(8) is used, that there appears a relationship $$\Delta I_d(V_d,V_g,t) > I_d(V_d,V_g)$$

from a certain moment t and the drain current $I_d$ becomes a negative value onward, while such a situation never occurs in the actual device.

In order to avoid this inconvenience, the present invention takes an approach, contrary to the foregoing general practice, to use the change of the threshold voltage $V_{th}$ for characterizing the degradation of the device characteristic.

Figure 9:
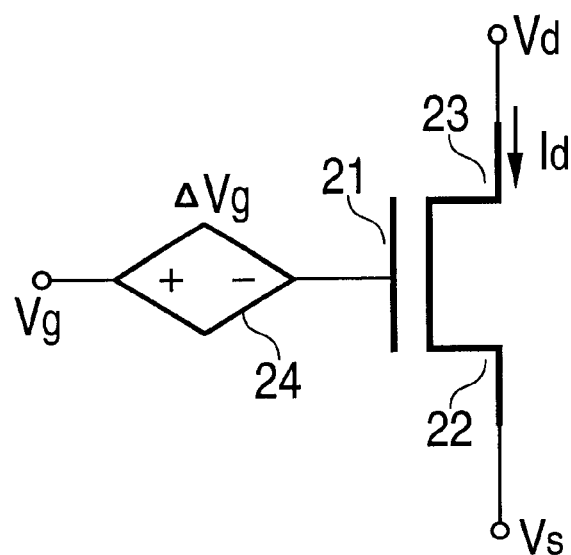
FIG. 9 is an equivalent circuit diagram including the degradation effect of the MISFET.

FIG. 9 shows an equivalent circuit diagram of a MISFET that takes into consideration the hot-carrier degradation of the characteristic, wherein the MISFET includes a gate electrode 21, a source region 22 and a drain region 23.

Referring to FIG. 9, an electric field 24 is created by the carriers captured by the surface states, and the electric field thus created 24 induces a shift of the gate voltage Vg applied to the gate electrode 21, by an amount of $\Delta V_g$. Thus, the drain current, initially represented as $\Delta I_d(V_d,V_g)$, is represented after the hot-carrier degradation as $\Delta I_d(V_d,V_g$31 $\Delta V_g)$. Thus, the foregoing gate voltage shift $\Delta V_g$ after the hot-carrier degradation of the MISFET is obtained as $$I_d(V_d,V_g,t)=I_d(V_d,V_g-\Delta V_g(V_d,V_g,t),0). \quad (9)$$

In this case, too, the gate voltage shift $\Delta V_g(V_d,V_g,t)$ is represented in terms of the forward bias degradation $\Delta V_{g(f)}$ and reverse bias degradation $\Delta V_{g(r)}$, by taking into consideration the effect of the deep and shallow surface states, as $$\Delta V_{g(f)}(V_d,V_g,t)=F_{df}(V_d,V_g)t^{nd}+F_{sf}(V_d,V_g)t^{ns}, \text{ and}$$

$$\Delta V_{g(r)}(V_d,V_g,t)=F_{dr}(V_d,V_g)t^{nd}+F_{sr}(V_d,V_g)t^{ns}. \quad (10)$$

Next, the process of obtaining the parameters $n_d$, $n_d$, $F_{df}$, $F_{sf}$, $F_{dr}$ and $F_{sr}$ used in Eq.(10) in detail.

Referring to FIG. 8 again, FIG. 8 shows the slope of the degradation or the exponent n for various D.C. stress conditions, wherein the solid circles represent the case in which a bias voltage $V_g$ is applied in the reverse direction, while the open squares represent the case in which a saturation bias condition $V_g$ is applied in the forward direction. Further, the open circles represent the case in which a linear bias condition $V_g$ is applied in the forward direction.

As will be apparent from FIG. 8, the exponent n depends on the gate voltage Vg under the reverse bias condition, while in the case of the forward bias condition, the exponent n is less dependent on the gate voltage $V_g$.

Hereinafter, this phenomenon of gate voltage dependence of the exponent n will be explained with reference to FIG. 10A.

Figure 10A:
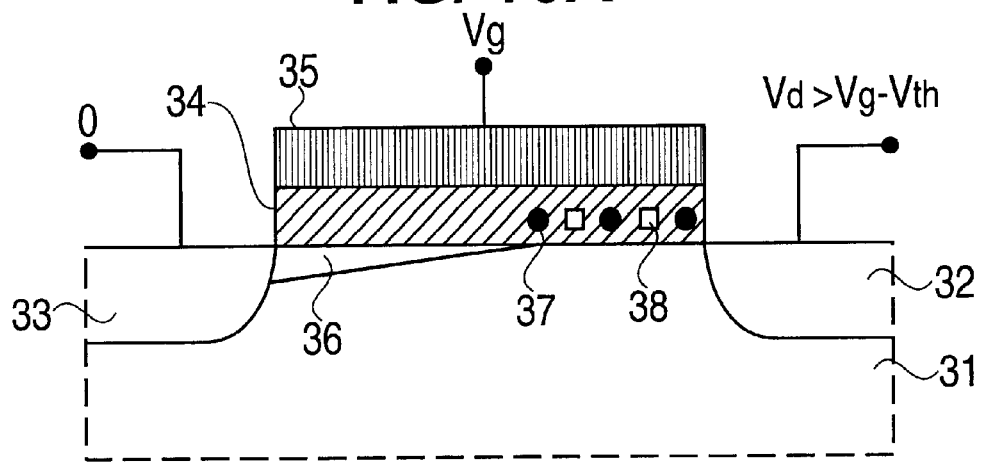
FIGS. 10A–10C are diagrams showing the capturing of the carriers by the deep and shallow surface states under various biasing conditions of the MISFET.
Figure 10B:
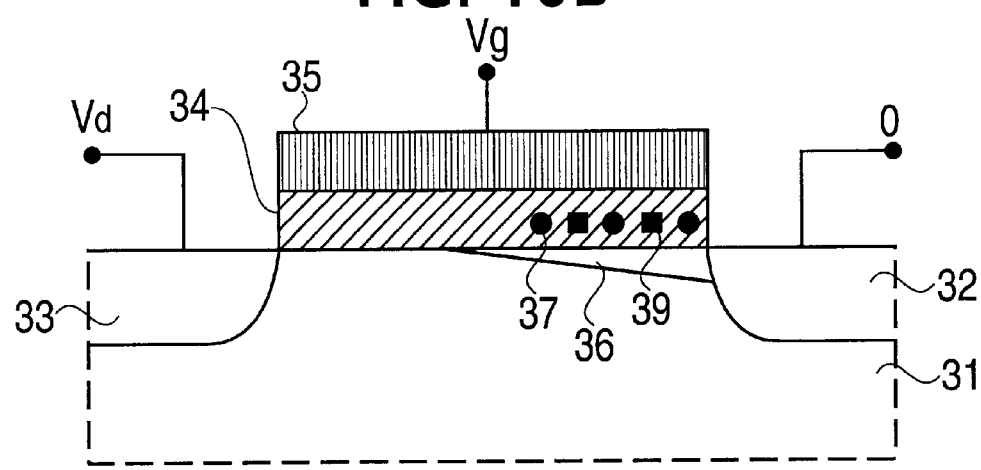
Figure 10C:
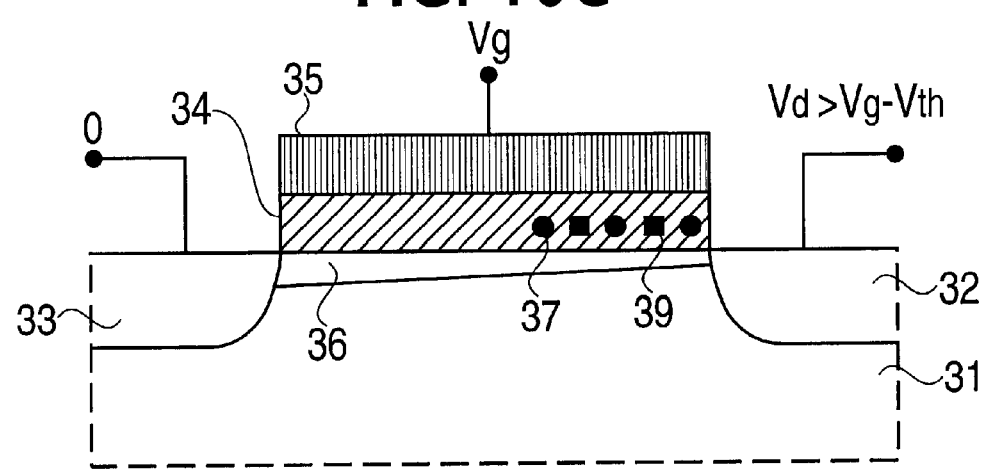

It should be noted that FIG. 10A represents a MISFET constructed on a semiconductor substrate 31 and includes a gate electrode 35 formed on the substrate 31 with a gate insulation film 34 interposed between the substrate 31 and the gate electrode 35. Further, there are formed source and drain regions 33 and 32 in the substrate 31 at both lateral sides of the gate electrode 35. FIGS. 10B and 10C show the same MISFET under different biasing conditions.

In the state of FIG. 10A, it should be noted that the MISFET is under forward biasing condition and is operating in the saturated state. In the gate insulation film 34, there are formed deep surface states 37 and shallow surface states 38, wherein the deep surface states 37 are filled with the carriers while the shallow surface states 38 are vacant in the state of FIG. 10A.

STEP 101

Referring to FIG. 10A, showing the device degradation under the forward biasing state with a low gate voltage $V_g$ satisfying the saturation condition $V_d > V_g - V_{th}$, the degradation $\Delta V_g$ is represented, in view of the fact that the carriers of the inversion layer are captured solely by the deep surface states 37 due to the depletion of the drain edge, as $$\Delta V_{g(f)}(V_d,V_g,t)=F_{df}(V_d,V_g)t^{nd},$$

$$F_{sf}(V_d,V_g)=0, \quad (11)$$

assuming that there holds the relationship $$V_d > V_g - V_{th}$$

in correspondence to the condition of saturation.

Thus, the slope $n_d$ of the curve representing the number of the deep surface states created as a result of capturing of the carries is obtained from the exponent n for the saturation region represented by the squares in FIG. 8.

In one approach, the exponent $n_d$ in the saturation region is obtained from FIG. 8 as the average of the various biasing conditions. Another approach for obtaining the exponent $n_d$ is to carry out a least-square-fitting of the function $$\text{fit}_{nd}(V_d,V_g,t)=\Delta V_{g(f)}(V_d,V_g,t)/\Delta V_{g(f)}(V_d,V_g,T), \quad (12)$$

which represents the quantity $\Delta V_{g(f)}(V_d,V_g,t)$ normalized with respect to a stress time T, such that the function $\text{fit}_{nd}(V_d,V_g,t)$ satisfies the relationship $$\text{fit}_{nd}(V_d,V_g,t)=At^{nd}.$$

The latter approach provides the exponent $n_d$ with high precision. In the trade-off, the calculation becomes complex.

STEP 102

Next, forward degradation functions $F_{df}(V_d,V_g)$ and $F_{sf}(V_d,V_g)$ for the saturation region under the forward-biasing state is obtained.

In this process, the function $F_{sf}(V_d,V_g)$ for the shallow surface states can be written, in view of the fact that there occurs no substantial capturing of the carriers by the shallow surface states, as $$F_{sf}(V_d,V_g)=0(V_d > V_g-V_{th}) \quad (13)$$

Further, the function $F_{df}(V_d,V_g)$ for the deep surface states is represented by introducing a new function $f_d(V_d-V_g+V_{th})$ as $$F_{df}(V_d,V_g)=f_d(V_d-V_g+V_{th})$$

$$(V_d > V_g-V_{th}). \quad (14)$$

FIG. 11 shows the observed bias dependence of the function $f_d(V)$ for the deep surface states for the case the D.C. stress condition was set as VD=3.0 V and VG=2.0V.

Referring to FIG. 11, the horizontal axis represents the quantity $V_d-V_g+V_{th}$, while the vertical axis represents the function $f_d(V)t^{n_d}$. Thus, by conducting a least-square-fit to the observed data points, the function $f_d(V)t^{n_d}$ is determined. In view of the fact that the exponent $n_d$ is already obtained according to the previously explained process, the term $t^{n_d}$ is also obtained and the function $f_d(V)$ is derived from the result of the foregoing least-square-fitting. Thus, the function $F_{df}(V_d,V_g)$ of Eq.(14) is obtained.

In this case, it should be noted that the bias voltage V for the function $f_d(V)$ has a value corresponding to the Fermi level $e_F$ in the vicinity of the drain edge as can be seen from FIG. 7B. In the case V=0, in other words when the condition $V_d=V_g-V_{th}$ is satisfied, the deep surface states are filled with the carries.

STEP 103

Next, the reverse degradation functions $F_{dr}(V_d,V_g)$ and $F_{sr}(V_d,V_g)$ are obtained.

Referring to 10B showing the reverse-biasing state, the capturing of the carriers does not depend on the drain voltage Vd as the carriers are captured by both the deep surface states 37 and shallow surface states 39 in the vicinity of the drain edge. Thus, the functions $F_{dr}(V_d,V_g)$ and $F_{sr}(V_d,V_g)$ solely depend on the gate voltage $V_g$.

Under such a condition, the deep surface states 37 are filled with the carriers of the inversion layer when the gate voltage Vg is set larger than the threshold voltage $V_{th}$. As this state is identical with the case in which the bias voltage V is set to zero in Eq.(14) above, the function $F_{dr}(V_d,V_g)$ is represented as $$F_{dr}(V_d,V_g)=f_d(0) \quad (15)$$

Further, the other function $F_{sr}(V_d,V_g)$ is defined as $$F_{sr}(V_d,V_g)=f_s(V_g). \quad (16)$$

Then a relationship $$F_{sr}(V_d,V_g)=f_s(V_g)=[\Delta V_{g(r)}-f_d(0)t^{n_d}]/t^{n_s} \quad (17)$$

is obtained from Eq.(16), by substituting Eq.(15) into Eq.(15).

FIG. 12 shows the observed gate bias dependence of the function $f_s(V_g)$ for the shallow surface states for each stress time t for the case of D.C. stress condition set as $V_D$=3.0 V, $V_G$=2.0 V. In FIG. 12, it should be noted that the vertical axis represents $f_s(V_g)$ and hence $[\Delta V_{g(r)}-V_{g(f)MAX}]/t^{n_s}=[\Delta V_{g(r)}-f_d(0)t^{n_d}]/t^{n_s}$, while the horizontal axis represents $V(=V_g-V_{th})$. By applying a least-square-fit to the observed data of FIG. 12, the function $f_s(V_g)$, and hence the function $F_{sr}(V_d,V_g)$, is obtained.

Figure 13:
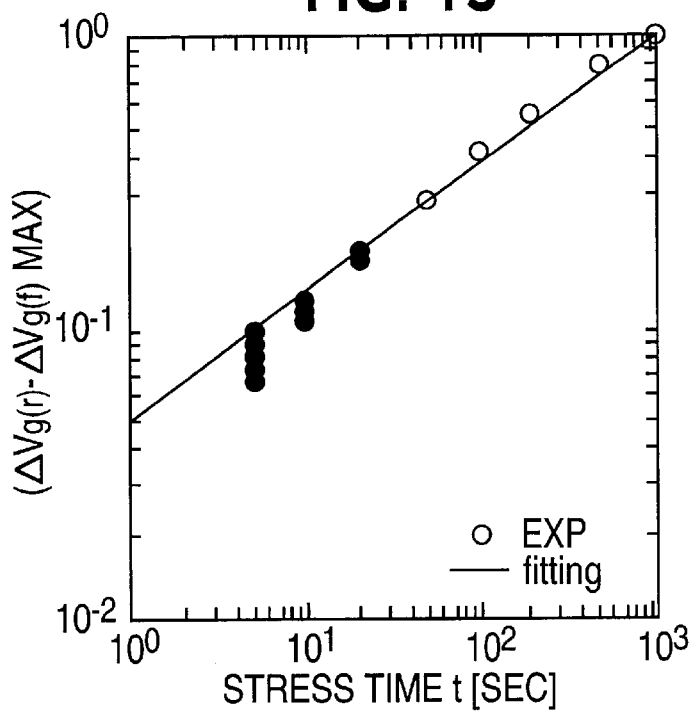
FIG. 13 is a diagram showing the stress time dependence of an exponent related to the shallow surface states.

FIG. 13 further shows the stress time dependence of the quantity $\Delta V_{g(r)}-\Delta V_{g(f)MAX}=(\Delta V_{g(r)}-f_d(0)t^{n_d})$ under the same D.C. stress condition of $V_D$=3.0 V and $V_G$=2.0 V, wherein FIG. 13 shows the relationship in a normalized state with respect to both the vertical axis and the horizontal axis. By conducting a least-square-fitting to the observed data of FIG. 13, the term $t^{n_s}$, and hence the exponent $n_s$, is obtained.

STEP 104

Next, the degradation function $F_{df}(V_d,V_g)$ and $F_{sf}(V_d,V_d)$ in the linear region of the forward-biasing state will be considered with reference to FIG. 10C.

Referring to FIG. 10C showing the MISFET under the biasing state of $V_d<V_g-V_{th}$, most of the deep surface states are filled with the carriers in the inversion layer and there holds a relationship $$F_{df}(V_d,V_g)=f_d(0). \quad (18)$$

Further, the function $F_{sf}(V_d,V_g)$ for the shallow surface states is also represented, in view of the fact that the degradation is continuous at the boundary ($V_d=V_g-V_{th}$) to the saturation region, as $$F_{sf}(V_g-V_{th},V_g)=0, \quad (19)$$

where reference should be made to Eq.(11).

Further, in view of the fact that the degradation of the characteristic is continuous at the boundary to the reverse-biasing region, there holds a relationship, from the foregoing relationship of Eq.(17), as $$F_{sf}(0,V_g)=F_{sr}(0,V_g)=f_s(V_g). \quad (20)$$

Thus, the function $F_{sf}(V_d,V_g)$ is used to fit the observed degradation data of the MISFET under the constraint that Eqs.(19) and (20) are satisfied. In this fitting process, it is advantageous, in view of the fact that the function $F_{sf}(V_d,V_g)$ changes significantly with the biasing condition, to normalize with respect to the function $f_s(1)$. Thus, the fitting of the function is preferably conducted with respect to the normalized function of $$F_{sf}(V_d,V_g)/f_s(1).$$

STEP 105

Next, the deviation at the time of the fitting process is absorbed by defining a residual function $f_{err}(V_d,V_g)$ as $$\Delta V_{g(f)}(V_g,V_d,t)=f_{err}(V_d,V_g)\Delta V_{g(f)}'(V_d,V_g,t)$$
$$\Delta V_{g(r)}(V_g,V_d,t)=f_{err}(V_d,V_g)\Delta V_{g(r)}'(V_d,V_g,t) \quad (21)$$

where $\Delta V_{g(f)}$ and $\Delta V_{g(r)}$ of Eq.(10) are used for $\Delta V_{g(f)}'$ and $\Delta V_{g(r)}'$, respectively. It should be noted that the deviation $\Delta V_{g(f)}$ or $\Delta V_{g(r)}$ arises from various reasons including parasitic resistance of the MISFET.

Figure 14:
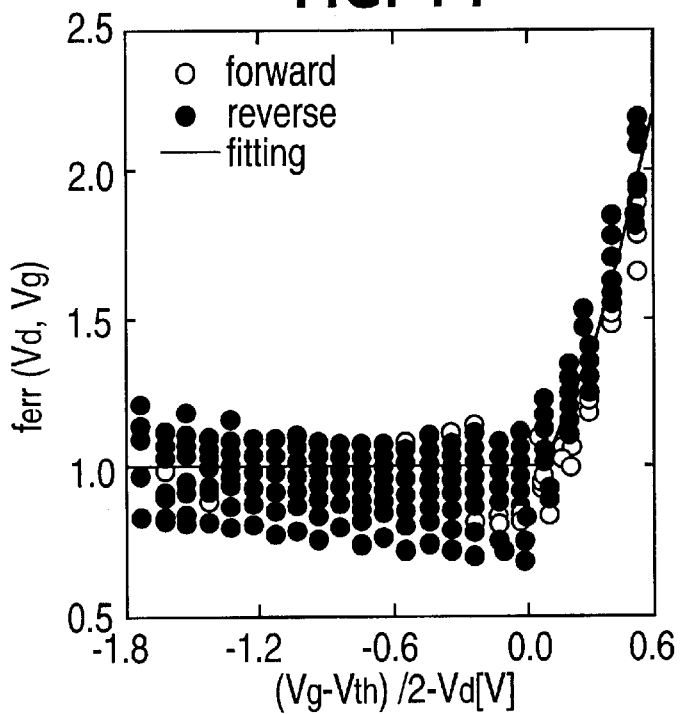
FIG. 14 is a diagram showing a bias dependence of a residual function.

FIG. 14 shows the observed bias dependence of the residual function $f_{err}(V_d,V_g)$ for the case the D.C. stress condition is set as $V_D$=3.0 V and $V_G$=2.0 V, wherein FIG. 14 shows the function $f_{err}(V_d,V_g)$ in the vertical axis and the quantity $(V_g-V_{th})/2-V_d$ in the horizontal axis. By applying a least-square-fitting process, the residual function $f_{err}(V_d,V_g)$ is obtained from these observed data of the MISFET.

According to the process described heretofore, which correspond to the steps 101–105 of FIG. 5, the parameters $n_d$ and $n_s$, and the functions $F_{df}(V_d,V_g)$, $F_{dr}(V_d,V_g)$, $F_{sf}(V_d,V_g)$, $F_{sr}(V_d,V_g)$, and $f_{err}(V_d,V_g)$ are determined from the observed degradation data of the MISFET.

Next, the process corresponding to the steps 106–111 of FIG. 6 will be described in detail. In the process of FIG. 6, the hot-carrier degradation is modeled for various different D.C. stress conditions, as noted already.

STEPS 106 & 107

Figure 15:
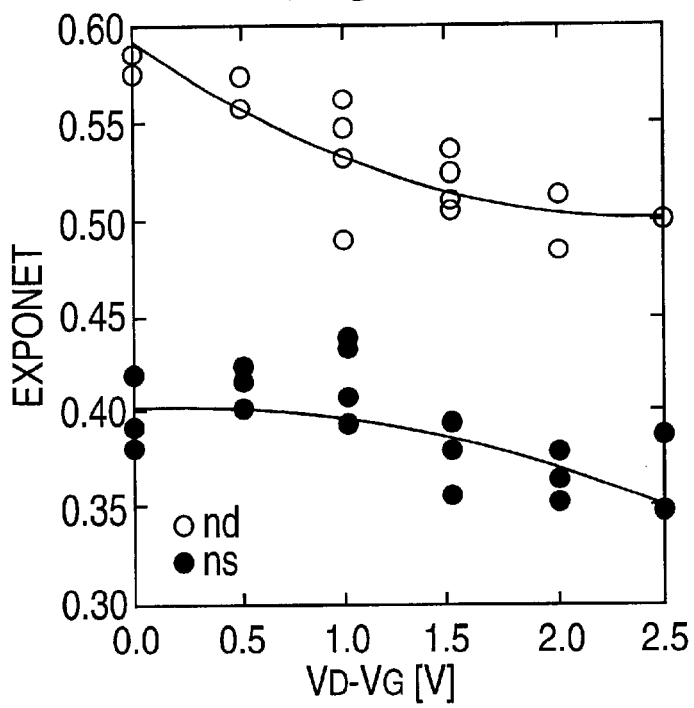
FIG. 15 is a diagrams showing a stress-condition dependence of the exponents related to the deep surface states and the shallow surface states.

FIG. 15 shows the D.C. stress dependence of the exponents $n_d$ and $n_s$, wherein FIG. 15 shows the exponent $n_d$ or $n_s$ in the vertical axis and the quantity $V_D-V_G$ in the horizontal axis.

Referring to FIG. 15, it can be seen that the value of the exponents $n_d$ and $n_s$ changes with the quantity $V_D-V_G$, and further that the value of the exponents $n_s$ and $n_d$ changes also with the absolute value of $V_D$ or $V_G$, even in such a case the quantity $V_D-V_G$ is held constant. Thus, in view of the D.C. stress dependency of the exponents nd and ns, new functions $f_{nd}$ and $f_{ns}$ are introduced for representing the exponents $n_d$ and $n_s$ as $$n_d=f_{nd}(V_D,V_G), \text{ and} \quad (22)$$

$$n_s=f_{ns}(V_D,V_G). \quad (23)$$

In the illustrated example, a parabolic curve is chosen for representing the functions $f_{nd}$ and $f_{ns}$ in view of the distribution pattern of the data in FIG. 15, and the exponents $n_d$ and $n_s$ are represented as $$n_d = f_{nd}(V_D, V_G) = n_{do} + n_{d1}(V_D - V_G) + n_{d2}(V_D - V_G)^2 \quad (24)$$

$$n_s = f_{ns}(V_D, V_G) = N_{so} + N_{s1}(V_D - V_G) + n_{s2}(V_D - V_G)^2. \quad (25)$$

Thereby, the parameters $n_{do}$, $n_{d1}$, $n_{d2}$, $n_{so}$, $n_{s1}$ and $N_{s2}$ are obtained by a least-square-fitting of the data points of FIG. 15.

STEP 108

Next, the D.C. stress dependence of the function $f_d(V)$ of Eq.(14) for the deep surface states is considered.

Figure 16:
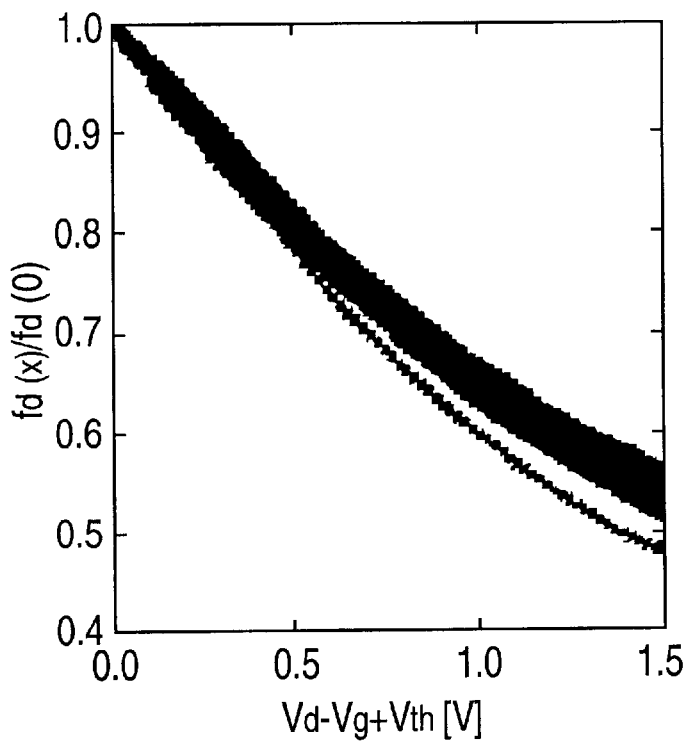
FIG. 16 is a diagram showing the stress-condition dependence of the function related to the deep surface states.

FIG. 16 shows the D.C. stress dependence of the function $f_d(V)$ normalized with respect to the quantity $f_d(0)$, which is the value of $f_d(V)$ where the condition $V_d = V_g - V_{th}$ is satisfied. As will be noted from FIG. 16, the data points are more on less aligned on the same curve. In FIG. 16, it should be noted that the vertical axis represents both the $f_{d(f)}$ and $f_{d(r)}$.

Now, when the curves of FIG. 16 are represented by a function $e_d(V)$, the function $f_{d(VD,VG)}$ for the deep surface states for the stress condition of $V_D$ and $V_G$ is represented, according to the definition, as $$f_{d(VD,VG)}(V)/f_{d(VD,VG)}(0) = e_d(V) f_{d(VD,VG)}(V) = f_{d(VD,VG)}(0) e_d(V) \quad (26)$$

STEP 109

Next, the D.C. stress dependence of the function $f_s(V)$ of Eq.(17) for the shallow surface states is considered.

Figure 17:
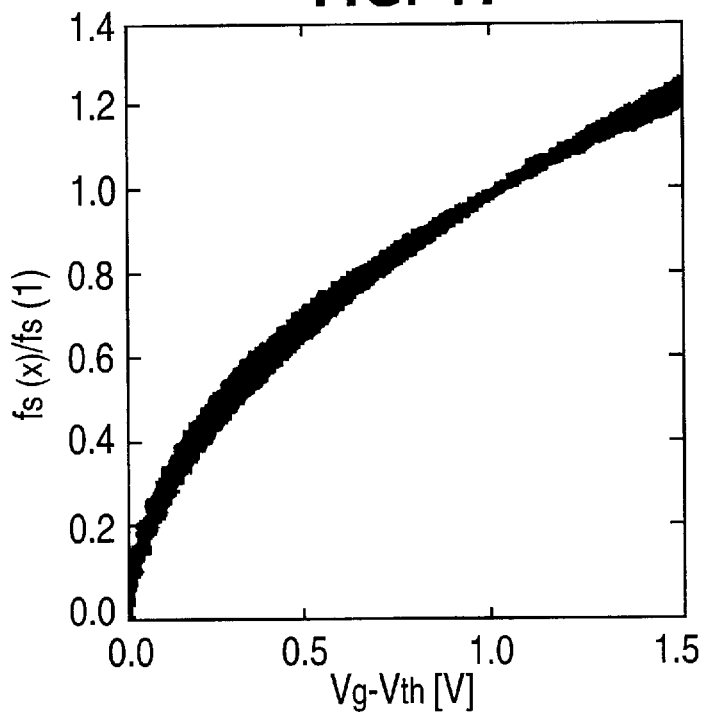
FIG. 17 is a diagram showing the stress-condition dependence of the function related to the shallow surface states.

FIG. 17 shows the D.C. stress dependence of the function $f_s(V)$ normalized with respect to the quantity $f_s(1)$, which is the value of $f_s(V)$ where the condition $V = V_d - V_{th}$ is satisfied. As will be noted from FIG. 17, the data points are more on less aligned on the same curve. In FIG. 17, it should be noted that the vertical axis represents both the $f_{s(f)}$ and $f_{s(r)}$.

Now, when the curves of FIG. 17 are represented by a function $e_s(V)$, the function $f_{s(VD,VG)}$ for the deep surface states for the stress condition of $V_D$ and $V_G$ is represented, according to the definition, as $$f_{s(VD,VG)}(V)/f_{s(VD,VG)}(1) = e_s(V)$$

$$f_{s(VD,VG)}(V) = f_{s(VD,VG)}(1) e_s(V) \quad (27)$$

STEP 110

Next, the D.C. stress dependence of the residual function $f_{err}(V_d, V_g)$ of Eq.(21) is considered.

Figure 18:
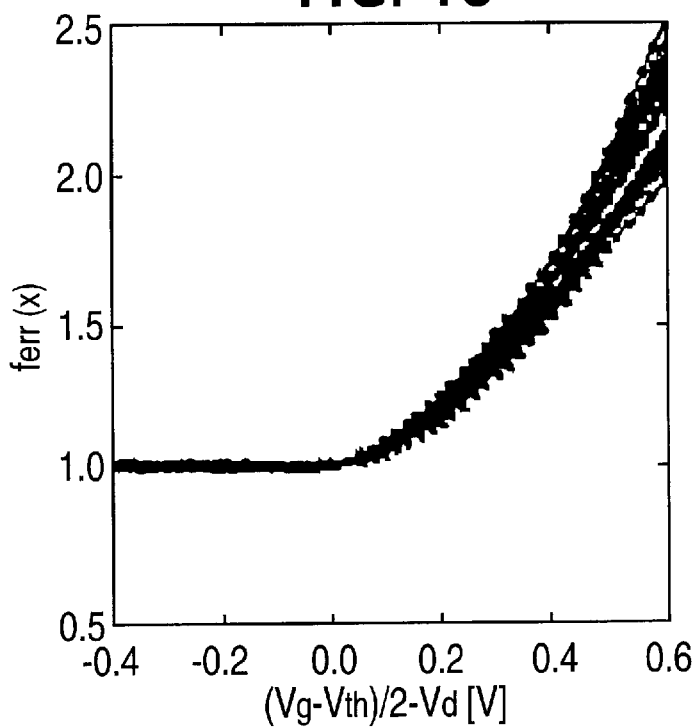
FIG. 18 is a diagram showing the stress-condition dependence of the residual function.

FIG. 18 shows the D.C. stress dependence of the residual function $f_{err}(V)$. As will be noted from FIG. 18, the data points are more on less aligned on the same curve. Thus, the function $f_{err}(V)$ is a function not depending on the D.C. stress condition. In FIG. 18, it should be noted that the vertical axis represents both of $f_{err(f)}$ and $f_{err(r)}$.

When it is necessary to represent the function $f_{err(x)}$ as a function of the D.C. stress condition VD, VG as $f_{err(VD,VG)}(V)$, the average of all the stress conditions are used as follows:

$$f_{err(VD,VG)}(V_d, V_g) = \text{SUM } (f_{err(VD,VG)}(V_f, V_g): \text{all the D.C. stress conditions})/\text{number of the D.C. stress conditions}) \quad (28)$$

In Eq.(28), the symbol "SUM $(f_{err(VD,VG)}(V_f, V_g)$: all the D.C. stress conditions)" is used as indicating the sum of the functions $f_{err(VD,VG)}(V_f, V_g)$ over all the D.C. stress conditions for the sake of convenience.

STEP 108

Next, the process returns to the step 108 of FIG. 6 and the function $f_d(V_D, V_G)(0)$ of Eq.(26) not determined yet is obtained. Here, the degradation $\Delta V_{g(f)}$ under the bias condition of $V = 0$, in other words under the bias condition of $V_d = V_g - V_{th}$, is obtained as $$\Delta V_{g(f)}(V_d, V_g, t) = f_{d(VD,VG)}(0) t^{nd} \quad (29)$$

for the MISFET that has been subjected to the D.C. stress condition of $V_D$ and $V_G$.

Now, the conventional simulation process explained with reference to Eq.(2) provides the representation of the function $f_{d(VD,VG)}(0)$ in terms of the drain current $I_D$ and the substrate current $I_{SUB}$ used at the time of the D.C. stressing process as $$f_{d(VD,VG)}(0) = (I_D/HW)^{nd} \cdot (I_{SUB}/I_D)^{mnd}, \quad (30)$$

wherein the representation of Eq.(30) is not applicable over a wide range of bias conditions as explained before.

In the present invention, a more generalized representation of $$f_{d(VD,VG)}(0) = (I_D/HW)^s (I_{SUB}/I_D)^m, \quad (31)$$

is obtained in correspondence to the foregoing Eq.(30). In more generalized form, a representation $$\text{Deg}(t) = (I_D/HW)^s (I_{SUB}/I_D)^m \cdot t^n, \quad (32)$$

is obtained.

Figure 19:
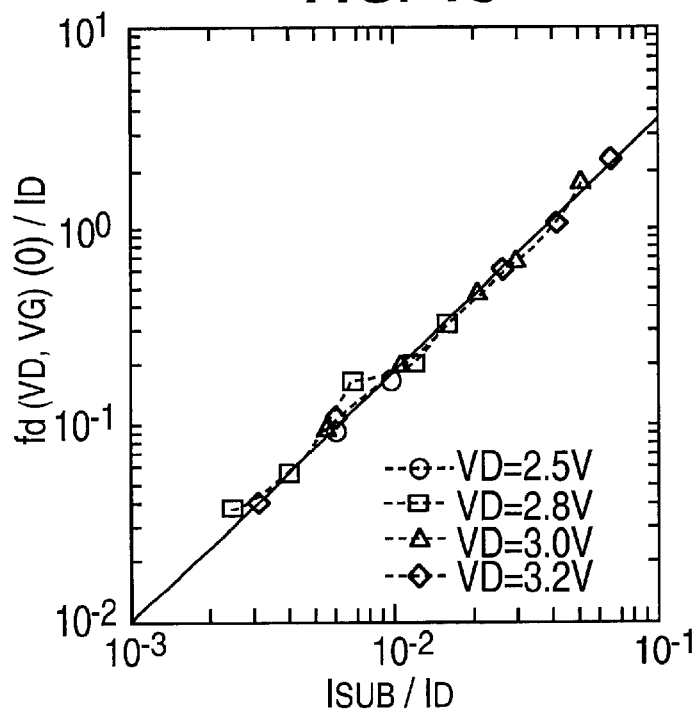
FIG. 19 is a diagram showing the stress-condition dependence of a function related to the deep surface states.

FIG. 19 shows the D.C. stress dependence of the quantity $f_{d(VD,VG)}(0)$. More specifically, FIG. 19 shows the quantity $f_{d(VD,VG)}(0)/I_D$ on the vertical axis and the quantity $I_{SUB}/I_D$ on the horizontal axis. As can be seen from FIG. 19, the observed degradation data points are aligned on a substantially single curve, indicating that the relationship between the quantity $f_{d(VD,VG)}(0)$ and the D.C. stress condition is represented by a single curve. In view of the fact that the relationship is represented by a single curve particularly when the vertical axis is represented in the form of $f_{d(VD,VG)}(0)/I_D$, the function $f_{d(VD,VG)}(0)$ can be represented, by setting the exponent s to be approximately 1 in the representation of Eq.(31) as $$f_{d(VD,VG)}(0) = (I_D/HW) \cdot (I_{SUB}/I_D)^m. \quad (33)$$

Thus, the quantity $f_{d(VD,VG)}(0)/I_D$, and hence the quantity $f_{d(VD,VG)}(0)$ is obtained from the relationship of FIG. 19, and the function $f_{d(VD,VG)}(V)$ for the deep surface states is obtained with regard to the D.C. stress condition of $V_D$ and $V_G$ from the relationship of Eq.(26) while using $e_d(V)$ obtained already from FIG. 16.

STEP 109

Next, the process returns to the step 109 and the function $f_{s(VD,VG)}(1)$ in the relationship of Eq.(27) not yet determined is obtained.

Figure 20:
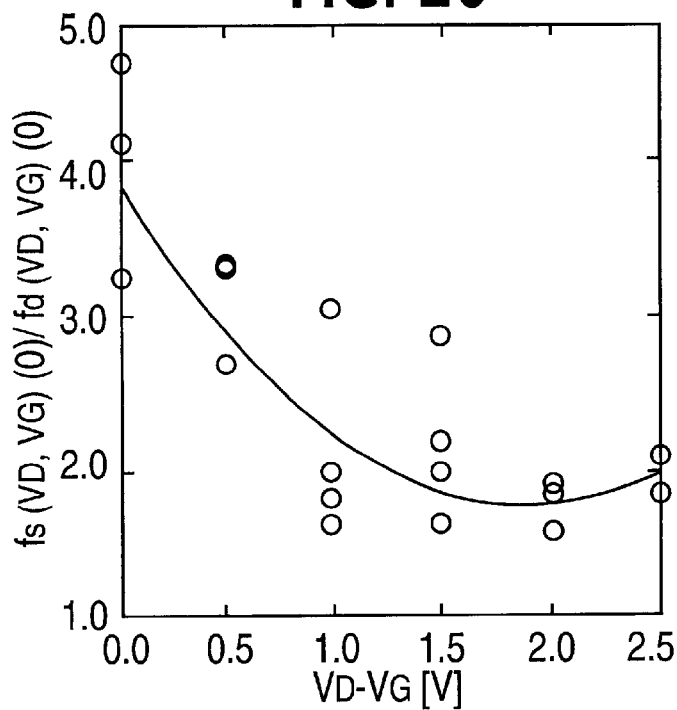
FIG. 20 is a diagram showing the stress-condition dependence of a function related to the shallow surface states.

FIG. 20 shows the D.C. stress dependence of the quantity $f_{s(VD,VG)}(1)$, wherein FIG. 20 shows the quantity $f_{s(VD,VG)}(1)/f_{d(VD,VG)}(0)$ on the vertical axis and the quantity $V_D - V_G$ on the horizontal axis.

Referring to FIG. 20, it will be noted that the quantity $f_{s(VD,VG)}(1)/f_{d(VD,VG)}(0)$ is fitted with a single curve $E_s(V_D, V_G)$, which is a function of the D.C. stress conditions $V_D$ and $V_G$, as $$f_{s(VD,VG)}(1)/f_{d(VD,VG)}(0) = E_s(V_D, V_G).$$

Thus, the foregoing relationship is written as $$f_{s(VD,VG)}(1) = f_{d(VD,VG)}(0) \cdot E_s(V_D, V_G) \quad (34)$$

As the quantity $f_{d(VD,VG)}(0)$ is obtained as noted above in the step 108 and the function $E_s(V_D, V_G)$ is obtained from FIG. 20, the function $f_{s(VD,VG)}(1)$, too, is obtained from the relationship of Eq.(34). As the function $f_{s(VD,VG)}(1)$ is thus obtained, and further in view of the fact that the quantity $e_s(V)$ is obtained as a result of the fitting of FIG. 17, the function $f_{s(VD,VG)}(V)$ for the shallow surface states for the stress condition $V_D$ and $V_G$ is obtained from the relationship of Eq.(27).

Summarizing above, the shift of the gate voltage $\Delta V_{g(f)}$ or $\Delta V_{g(r)}$ associated with the MISFET degradation is obtained, by using the hot-carrier degradation function $F_{sf}(V_d,V_g)(/f_s(1))$ of the MISFET which has been subjected to the D.C. stress at $V_D$ and $V_G$ with the drain current $I_D$ and the substrate current $I_{SUB}$ during the D.C. stress test, as $$\Delta V_{g(f)}(V_d,V_g,t)=f_{err}(V_d,V_g)\cdot f_d(V_d-V_g+V_{th})\times t^{nd} \quad (35)$$

for the saturation region where the condition $V_d > V_g - V_{th}$ holds, or as $$\Delta V_{g(f)}(V_d,V_g,t)=f_{err}(V_d,V_g)\cdot (f_d(0)t^{nd}+F_{sf}(V_d,V_g)t^{nd}, \quad (36)$$

for the linear region where the condition $V_d < V_g - V_{th}$ holds, or as $$\Delta V_{g(r)}(V_d,V_g,t)=f_{err}(V_d,V_g)\cdot (f_d(0)t^{nd}+f_s(V_g)t^{ns}), \quad (37)$$

for the reverse-biasing region, wherein Eq.(35) is derived from Eqs.(21), (10) and (14), while Eq.(36) is derived from Eqs.(21), (10) and (18). Further, Eq.(37) is derived from Eqs.(21),(10) and (17). It should be noted that the function $F_{sf}(V_d,V_s)$ (or $F_{sf}(V_d,V_s)/f_s(1)$) satisfies Eqs.(19) and (20) noted above.

By substituting the parameters $n_d$, $n_s$, $f_d(V)$, $f_s(V)$, $f_{err}(V_d,V_g)$ obtained by the fitting process into these equations, the gate voltage shift $\Delta V_{g(f)}$ and $\Delta V_{g(r)}$ are obtained.

It should be noted that the foregoing parameters $n_d$, $n_s$, $f_d(V)$, $f_s(V)$ and $f_{err}(V_d,V_g)$ are obtained from Eqs.(24) through (27) and Eq.(34) above as $$n_d=n_{do}+n_{d1}(V_D-V_G)+n_{d2}\cdot(V_D-V_G)^2, \quad (38)$$

$$n_s=n_{so}+n_{s1}\cdot(V_D-V_G)+n_{s2}\cdot(V_D-V_G)^2, \quad (39)$$

$$f_d(V)=f_{d(VD,VG)}(0)\cdot e_d(V), \text{ and} \quad (40)$$

$$f_s(V)=f_{d(VD,VG)}(0)\cdot E_s(V_D,V_G)\cdot e_s(V). \quad (41)$$

Further, the quantities $f_d(V)$ and $f_s(V)$ are obtained from Eq.(33) above as $$f_{d(VD,VG)}(0)=(I_D/HW)^s\cdot (I_{SUB}/I_D)^m, \quad (42)$$

wherein a good approximation is usually obtained by setting the parameter s to 1.

As noted above, the fitting parameters $n_{do}$, $n_{d1}$, $n_{d2}$, $n_{so}$, $n_{s1}$, $N_{s2}$, H, the exponents m and s, and the functions $e_d(V)$, $e_s(V)$, $E_s(V_D,V_G)$, $f_{err}(V_d,V_g)$, $F_{sf}(V_d,V_g)/f_s(1)$ used for the D.C. stress degradation simulation for various D.C. stress conditions, are obtained by the fitting of the observed degradation data.

SECOND EMBODIMENT

Hereinafter, the result of the hot-carrier simulation conducted on an n-channel MOSFET having a gate length L of 0.18 μm and gate width W of 10 μm and the result of comparison with the actual degradation experiment will be described.

Referring to FIG. 21A showing the relationship between the drain current $I_d$ (A/10 μm) and the drain voltage $V_d$ for the case the MOSFET is subjected to the D.C. stress under the condition of $V_D$=3.0 V and $V_G$=1.5 V for the duration t of 1000 seconds, it will be noted that an excellent agreement exists between the result of the simulation and the result of the experiments for the measurement conducted under the gate voltages $V_g$ of 0.6 V, 1.2 V and 1.8V, wherein it should be noted that the agreement holds for both the forward-biasing condition and the reverse-biasing condition. In FIG. 21A, it should be noted that the continuous line represents the $I_d$-$V_d$ characteristic at t=0, in other words before the D.C. stress experiment.

FIG. 21B shows the drain current degradation $\Delta I_d$ caused as a result of the D.C. stress test at $V_D$=3.0 V and $V_G$=1.5 V as normalized by the drain current $I_d$ at t=0, in other words before the D.C. stress test. Thus, FIG. 21B shows the stress time dependence of the drain current degradation rate $\Delta I_d/I_d$ and presents the result at four measuring conditions ($V_d$=1.0 V, $V_g$=1.0 V; $V_d$=1.0 V, $V_g$=1.8 V; $V_d$=1.8 V, $V_g$=1.0 V; and $V_d$=1.8 V, $V_g$=1.8 V).

As will be apparent from FIG. 21B, an excellent agreement is observed under any of the biasing conditions including forward-biasing condition and reverse-biasing condition.

FIG. 22A shows the relationship between the drain current $I_d$ (A/10 μm) and the drain voltage $V_d$ for the case the MOSFET is subjected to a D.C. stress test under the condition of $V_D$=2.5 V and $V_G$=1.5 V for the duration t of 50,000 seconds or about 14 hours.

Referring to FIG. 22A, there exist an excellent agreement between the result of the simulation and the actual degradation of the MOSFET at each of the gate voltages $V_g$ of 0.6 V, 1.2 V and 1.8 V, including the forward-biasing condition and reverse-biasing condition.

FIG. 22B shows stress time dependence of the drain current degradation rate $\Delta I_d/I_d$(t=0) for the case the D.C. stress test is conducted at $V_D$=1.5 V and $V_G$=1.5 V. FIG. 21B shows the stress time dependence of the drain current degradation rate $\Delta I_d/I_d$ for four measuring bias conditions ($V_d$=1.0 V, $V_g$=1.0 V; $V_d$=1.0 V, $V_g$=1.8 V; $V_d$=1.8 V, $V_g$=1.0 V; and $V_d$=1.8 V, $V_g$=1.8 V).

As will be apparent from FIG. 22B, a fairly good agreement is observed under any of the biasing conditions including forward-biasing condition and reverse-biasing condition.

The foregoing agreement between the result of the simulation and the observed result clearly demonstrates the effectiveness of the simulation process of the present invention. By feeding back the result of the simulation to the designing of the semiconductor device, it becomes possible to fabricate a MISFET having a desired device characteristic with controlled degradation.

It should be noted that the foregoing simulation process, explained with reference to the n-channel MISFET, is also applicable to p-channel MISFET. In this case, the shallow surface state ae formed in the vicinity of the valence band. In the case of the p-channel MISFET, the polarity is merely reversed for the D.C. stress conditions $V_D$ and $V_G$.

THIRD EMBODIMENT

Figure 23:
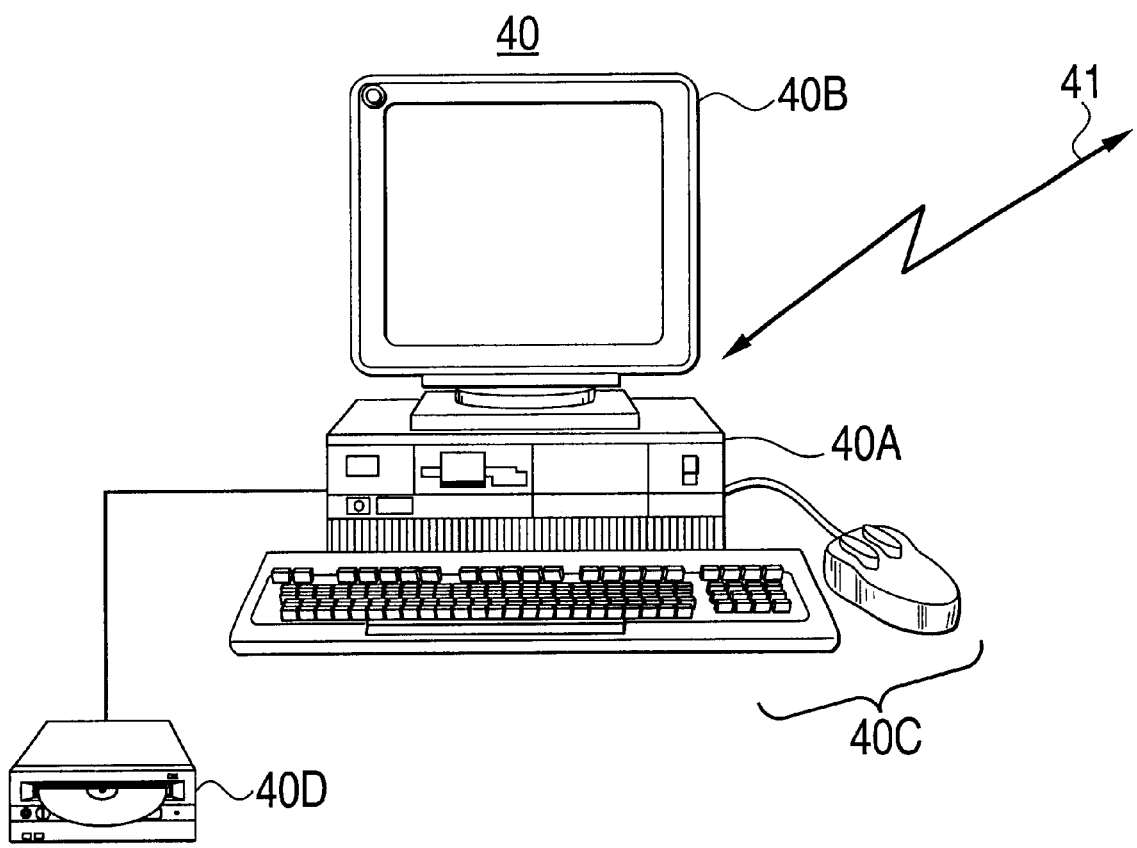
FIG. 23 is a diagram showing a computer system used for the simulation of the present invention.

FIG. 23 shows the construction of a computer system 40 used for carrying out the simulation process of FIGS. 5 and 6.

Referring to FIG. 23, the computer system includes a computer 40A typically of a personal computer or a work station equipped with a processing unit such as CPU, a main memory, and an auxiliary storage device such as a hard disk drive, wherein a display unit 40B is provided in cooperation with the computer 40A. Further, there are provided an input/output device 40C including a keyboard, mouse pointer and another input/output device 40D such as a an optical disk drive or a modem connected to a network. Thereby, the storage device holds the program of the simulation process and the computer 40A carries out the simulation according to the process.

In a typical example, the program of the simulation process is supplied to the computer 40A via the optical disk drive 40D in the form recorded on an optical disk. Alternatively, the input/output device 40D may be a modem connected to a network and the program may be supplied to the computer 40A via the modem 40D.

Further, the present invention is by no means limited to the embodiments described heretofore, but various variations and modifications may be made within the scope of the invention.

What is claimed is:

1. A method, comprising;
    performing a hot-carrier degradation simulation of a metal-insulator-semiconductor transistor by calculating a degradation of a device characteristic of the metal-insulator-semiconductor transistor using at least both of deep surface states and shallow surface states formed in a gate insulation film, said calculating comprising,
    obtaining a first degradation quantity that depends on the deep surface states,
    obtaining a second degradation quantity that depends on the shallow surface states, and
    obtaining the sum of the first degradation quantity and the second degradation quantity.

2. A method as claimed in claim 1, wherein said obtaining the first degradation quantity comprises representing the first degradation quantity as a first power function having a first exponent, and said obtaining the second degradation quantity comprises representing the second degradation quantity as a second power function having a second exponent different from the first exponent.

3. A method as claimed in claim 1, wherein said obtaining the first degradation quantity comprises representing the number of the deep surface states as a first power function having a first exponent with regard to a stress time, and wherein said obtaining the second degradation quantity comprises representing the number of the shallow surface states as a second power function having a second exponent with regard to the stress time, the first and second exponents being different from each other.

4. A method as claimed in claim 3, wherein the first exponent is larger than the second exponent.

5. A method as claimed in claim 2, further comprising:
    operating, after carrying out a stress test, the metal-insulator-semiconductor transistor under a first condition wherein a Fermi level substantially coincides with an energy level of the deep surface states;
    operating, after the stress test, the metal-insulator-semiconductor transistor under a second condition wherein the Fermi level substantially coincides with an energy level of the shallow surface states;
    obtaining the first exponent from an operation conducted under the first condition; and
    obtaining the second exponent from an operation conducted under the second condition.

6. A method as claimed in claim 5, wherein said obtaining the second exponent is conducted after said obtaining the first exponent by using the first exponent.

7. A method as claimed in claim 5, wherein said obtaining the first exponent and said obtaining second exponent respectively comprise fitting the first power function and the second power function to a result of the stress test, said obtaining the first exponent and said obtaining the second exponent further comprising representing a residue of fitting by a residual function.

8. A method as claimed in claim 5, wherein said operating the metal-insulator-semiconductor transistor under the first condition comprises operating the metal-insulator-semiconductor transistor under a forward bias condition, and wherein said operating the metal-insulator-semiconductor transistor under the second condition comprises operating the metal-insulator-semiconductor transistor under a reverse bias condition.

9. A method of fabricating a metal-insulator-semiconductor transistor, comprising:
    performing a hot-carrier degradation simulation; and
    designing the metal-insulator-semiconductor transistor while using a result of the hot-carrier degradation simulation,
    said performing the hot-carrier degradation simulation comprising calculating a degradation of a device characteristic of the metal-insulator-semiconductor transistor by using at least both of deep surface states and shallow surface states formed in a gate insulation film.

10. A method as claimed in claim 9, wherein said calculating the degradation comprises:
    obtaining a first degradation quantity depending on the deep surface states;
    obtaining a second degradation quantity depending on the shallow surface states; and
    obtaining the sum of the first degradation quantity and the second degradation quantity.

11. A method as claimed in claim 10, wherein said calculating the first degradation quantity comprises representing the first degradation quantity as a first power function having a first exponent, and said calculating the second degradation quantity comprises representing the second degradation quantity as a second power function having a second exponent different from the first exponent.

12. A method as claimed in claim 10, wherein said calculating the first degradation quantity comprises representing the number of the deep surface states as a first power function having a first exponent with regard to a stress time, and wherein said calculating the second degradation quantity comprises representing the number of the shallow surface states as a second power function having a second exponent with regard to the stress time, the first exponent and the second exponent being different from each other.

13. A method as claimed in claim 12, wherein the first exponent is larger than the second exponent.

14. A method as claimed in claim 13, further comprising:
    operating, after carrying out a stress test, the metal-insulator-semiconductor transistor under a first condition wherein a Fermi level substantially coincides with an energy level of the deep surface states;
    operating, after the stress test, the metal-insulator-semiconductor transistor under a second condition wherein the Fermi level substantially coincides with an energy level of the shallow surface states;
    obtaining the first exponent from an operation conducted under the first condition; and
    obtaining the second exponent from an operation conducted under the second condition.

15. A method as claimed in claim 14, wherein said obtaining the second exponent is conducted after said obtaining the first exponent by using the first exponent.

16. A method as claimed in claim 14, wherein said obtaining the first exponent and said obtaining second exponent respectively comprise fitting the first power function and the second power function to a result of the stress test, said obtaining the first exponent and said obtaining the second exponent further comprising representing a residue of fitting by a residual function.

17. A method as claimed in claim 14, wherein said operating the metal-insulator-semiconductor transistor under the first condition comprises operating the metal-insulator-semiconductor transistor under a forward bias condition, and wherein said operating the metal-insulator-semiconductor transistor under the second condition comprises operating the metal-insulator-semiconductor transistor under a reverse bias condition.

18. A computer-readable medium storing a program code, comprising:

performing a hot-carrier degradation simulation of a metal-insulator-semiconductor transistor by calculating a degradation of a device characteristic of the metal-insulator-semiconductor transistor using at least both of deep surface states and shallow surface states formed in a gate insulation film, said calculating comprising, obtaining a first degradation quantity that depends on the deep surface states, obtaining a second degradation quantity that depends on the shallow surface states, and obtaining a sum of the first degradation quantity and the second degradation quantity.

\* \* \* \* \*